United States Patent
Mullner et al.

(10) Patent No.: US 10,260,486 B2
(45) Date of Patent: Apr. 16, 2019

(54) ACTUATION VIA MAGNETIC TORQUE DRIVEN DEFORMATION

(71) Applicant: BOISE STATE UNIVERSITY, Boise, ID (US)

(72) Inventors: Peter Mullner, Boise, ID (US); David C. Dunand, Evanston, IL (US); Nikole J. Kucza, Boise, ID (US); Peiqi Zheng, Ramsey, NJ (US)

(73) Assignee: BOISE STATE UNIVERSITY, Boise, ID (US)

( * ) Notice: Subject to any disclaimer, the term of this patent is extended or adjusted under 35 U.S.C. 154(b) by 575 days.

(21) Appl. No.: 15/068,237

(22) Filed: Mar. 11, 2016

(65) Prior Publication Data
US 2016/0265516 A1 Sep. 15, 2016

Related U.S. Application Data

(60) Provisional application No. 62/131,729, filed on Mar. 11, 2015.

(51) Int. Cl.
*F03G 7/06* (2006.01)

(52) U.S. Cl.
CPC .................... *F03G 7/065* (2013.01)

(58) Field of Classification Search
CPC ....................................... F03G 7/065
USPC ..................................... 310/26, 307
See application file for complete search history.

(56) References Cited

U.S. PATENT DOCUMENTS

| | | | | |
|---|---|---|---|---|
| 2,782,280 A | * | 2/1957 | Bickford, Jr. | H01H 55/00 310/26 |
| 7,964,290 B2 | * | 6/2011 | Mullner | C22C 19/00 428/613 |
| 2003/0000605 A1 | * | 1/2003 | Homma | C22F 1/006 148/563 |
| 2008/0302024 A1 | * | 12/2008 | Browne | E04B 1/00 52/1 |

(Continued)

FOREIGN PATENT DOCUMENTS

WO  WO-2013/079794 A2 * 6/2013

OTHER PUBLICATIONS

Zheng et al; "Mechanical and magnetic behavior of oligocrystalline Ni—Mn—Ga microwires"; Journal of Alloys and Compounds 624 (2015) 226-233.

(Continued)

*Primary Examiner* — Thomas M Dougherty
(74) *Attorney, Agent, or Firm* — Parsons Behle & Latimer

(57) ABSTRACT

A system may include an actuation member having a first end and a second end. A length of the actuation member is greater than a width of the actuation member. The length extends from the first end to the second end along a longitudinal axis when the actuation member is undeformed. The actuation member may include a magnetic shape memory alloy. The system may further include an anchor retaining the first end of the actuation member. The second end of the actuation member may be free to move laterally to the longitudinal axis in response to a deformation of the actuation member. The system may also include a magnetic field source in proximity to the actuation member. The magnetic field source may be configurable to alter a magnetic field applied to the actuation member to adjust the extent of deformation of the actuation member.

22 Claims, 11 Drawing Sheets

(56) References Cited

U.S. PATENT DOCUMENTS

| | | | | |
|---|---|---|---|---|
| 2012/0174571 A1* | 7/2012 | Villanueva | ............... | F03G 7/065 60/527 |
| 2015/0354046 A1* | 12/2015 | Tuncer | ...................... | C22F 1/08 148/539 |
| 2016/0227088 A1* | 8/2016 | Brown | .................... | F03G 7/065 |
| 2016/0229519 A1* | 8/2016 | Dilligan | .................... | B64C 3/48 |
| 2017/0167472 A1* | 6/2017 | Schuh | ..................... | F03G 7/065 |

OTHER PUBLICATIONS

Kucza et al; "Magnetic-field-induced bending and straining of Ni—Mn—Ga single crystal beams with high aspect ratios"; Acta Materialia 95 (2015) 284-290.

Dunand, D.C. and P. Mullner, Size Effects on Magnetic Actuation in Ni—Mn—Ga Shape-Memory Alloys. Advanced Materials, 2011. 23(2): p. 216-232.

Sozinov, A., et al., Giant magnetic-field-induced strain in NiMnGa seven-layered martensitic phase. Applied Physics Letters, 2002. 80(10): p. 1746-1748.

Lazpita, P. et al., Correlation between magnetization and deformation in a NiMnGa shape memory alloy polycrystalline ribbon. Sensor Letters, 2007. 5(1): p. 65-68.

Boonyongmaneerat, Y., et al., Increasing magnetoplasticity in polycrystalline Ni—Mn—Ga by reducing internal constraints through porosity. Physical Review Letters, 2007. 99(24).

Chmielus, M., et al., Giant magnetic-field-induced strains in polycrystalline Ni—Mn—Ga foams. Nature Materials, 2009. 8(11): p. 863-866.

Scheerbaum, N., et al., Magnetic field-induced twin boundary motion in polycrystalline Ni—Mn—Ga fibres. New Journal of Physics, 2008. 10.

Scheerbaum, N., et al., Textured polymer bonded composites with Ni—Mn—Ga magnetic shape memory particles. Acta Materialia, 2007. 55(8): p. 2707-2713.

Liu, J. et al., Influence of annealing on magnetic field-induced structural transformation and magnetocaloric effect in Ni—Mn—In—Co ribbons. Acta Materialia, 2009. 57(16): p. 4911-4920.

Schlagel, D.L., et al., Chemical segregation during bulk single crystal preparation of Ni—Mn—Ga ferromagnetic shape memory alloys. Journal of Alloys and Compounds, 2000. 312(1-2): p. 77-85.

Richard, M.L., et al., Chemical order in off-stoichiometric Ni—Mn—Ga ferromagnetic shape-memory alloys studied with neutron diffraction. Philosophical Magazine, 2007. 87(23): p. 3437-3447.

Rothenbuhler, A., et al., Application of Image Processing to track Twin Boundary Motion in Magnetic Shape Memory Alloys. SPIE-IS&T/ vol. 8300 83000A-7.

Chernenko, V.A., et al., Premartensitic phenomena and other phase transformations in Ni—Mn—Ga alloys studied by dynamical mechanical analysis and electron diffraction. Acta Materialia, 2002. 50(1): p. 53-60.

Chernenko, V.A., et al., Sequence of martensitic transformations in Ni—Mn—Ga alloys. Physical Review B, 1998. 57(5): p. 2659-2662.

Chernenko, V.A., et al., Stress-temperature phase diagram of a ferromagnetic Ni—Mn—Ga shape memory alloy. Acta Materialia, 2005. 53(19): p. 5071-5077.

Glavatskyy, I. and N. Glavatska, Giant elasticity in the Ni—Mn—Ga single crystalline FSMA martensites. Esomat 2009—8th European Symposium on Martensitic Transformations, 2009.

* cited by examiner

ACTUATION VIA MAGNETIC TORQUE DRIVEN DEFORMATION

CROSS-REFERENCE TO RELATED APPLICATIONS

This application, under 35 U.S.C. § 119, claims the benefit of U.S. Provisional Patent Application Ser. No. 62/131,729 filed on Mar. 11, 2015 and entitled "Actuation Via Magnetic Torque Driven Deformation," the contents of which are hereby incorporated by reference in their entirety.

GOVERNMENT LICENSE RIGHTS

This invention was made with government support under Grant Nos. DMR-1207192 and DMR-1207282 awarded by the National Science Foundation. The Government has certain rights in this invention.

FIELD OF THE DISCLOSURE

This disclosure relates generally to actuation via magnetic torque driven deformation.

BACKGROUND

Magnetic-field-induced strain (MFIS) is the longitudinal deformation exhibited by magnetic shape-memory alloys (MSMA). MFIS is carried out by crystallographic twinning and produces an axial actuation stroke of up to the twinning strain (e.g. 6% for 10M Ni—Mn—Ga). MFIS may be harnessed to perform actuation operations. Examples, of actuation applications that are based on MFIS include micropumps as described in U.S. patent application Ser. No. 13/550,386 filed on Jul. 16, 2012 and entitled "Actuation Method and Apparatus, Micropump, and PCR Enhancement Method," now U.S. Pat. No. 9,091,251 and U.S. patent application Ser. No. 14/493,674 filed on Sep. 23, 2014 and entitled "Electrically Driven Magnetic Shape Memory Apparatus and Method," the contents of each of which are hereby incorporated by reference in their entirety.

For typical applications relying on MFIS, a stroke associated with the actuation member is relatively small compared to the length of the actuation member (on the order of 6%). What is needed is an actuation device with a long stroke. Further, in these applications, the work output of the actuation member is limited by its magnetocrystalline anisotropy energy. As such, MSMA actuation members that rely purely on longitudinal MFIS for actuation may not be sufficient for some applications.

SUMMARY

Disclosed herein are systems and methods that resolve or mitigate at least one of the deficiencies described with reference to typical actuation mechanisms. In an embodiment, a method includes retaining, at an anchor, a first end of an actuation member. A length of the actuation member is greater than a width of the actuation member. The length extends from the first end of the actuation member to a second end of the actuation member along a longitudinal axis when the actuation member is undeformed. The actuation member includes a magnetic shape memory alloy. The method further includes deforming the actuation member with a magnetic field to move the second end of the actuation member laterally to the longitudinal axis. The method also includes altering, at a magnetic field source, the magnetic field applied to the actuation member to alter the deformation of the actuation member.

In some embodiments, the method further includes moving an object by applying a force to the object with the deformation of the actuation member. In some embodiments, the method further includes applying a force caused by the deformation of the actuation member to a fluid to invoke movement of a body connected to the anchor through the fluid. In some embodiments, altering the magnetic field applied to the actuation member further comprises setting the magnetic field to a predetermined magnitude that results in a predetermined deformation of the actuation member. In some embodiments, altering the magnetic field applied to the actuation member further comprises setting the magnetic field to a predetermined direction that results in a predetermined deformation of the actuation member. In some embodiments, the predetermined deformation results in a predetermined angle of the actuation member at the second end relative to the longitudinal axis. In some embodiments, a lateral stroke value associated with the actuation member is greater than at least 10% compared to the length of the actuation member. In some embodiments, a work output of the deformation is based on a shape anisotropy of the actuation member.

In an embodiment, a system includes an actuation member having a first end and a second end. A length of the actuation member is greater than a width of the actuation member. The length extends from the first end to the second end along a longitudinal axis when the actuation member is undeformed. The actuation member includes a magnetic shape memory alloy. The system further includes an anchor retaining the first end of the actuation member. The second end of the actuation member is free to move laterally to the longitudinal axis in response to a deformation of the actuation member. The system also includes a magnetic field source in proximity to the actuation member. The magnetic field source is configurable to alter a magnetic field applied to the actuation member to adjust the extent of deformation of the actuation member.

In some embodiments, the actuation member is a cylindrical wire. In some embodiments, the deformation of the actuation member is caused at least partially due to crystallographic twinning. In some embodiments, the magnetic shape memory alloy includes a Nickel-Manganese-Gallium alloy. In some embodiments, the magnetic shape memory alloy is martensitic at or below a standard operating temperature. In some embodiments, the standard operating temperature is room temperature and below 25° C. In some embodiments, the magnetic shape memory alloy is austenitic at or above a threshold temperature above the standard operating temperature. In some embodiments, the threshold temperature is about 10 or more degrees higher than the standard operation temperature. In some embodiments, the magnetic shape memory alloy has a Curie temperature of about 82° C. In some embodiments, the system is incorporated into at least one device selected from the group consisting of micro-actuators, sensors, magnetic cooling systems, and energy harvesting devices.

In an embodiment, a method includes forming an actuation member having a first end and a second end. A length of the actuation member is greater than a width of the actuation member. The length extends from the first end to the second end along a longitudinal axis when the actuation member is undeformed. The actuation member is formed from a magnetic shape memory alloy. The method further includes connecting the first end of the actuation member to an anchor. The anchor retains the first end of the actuation member while the second end of the actuation member is free to move laterally to the longitudinal axis in response to deformation of the actuation member. The method also includes positioning the actuation member in proximity to a magnetic field source. The magnetic field source is configurable to alter a magnetic field applied to the actuation member to adjust the extent of deformation of the actuation member.

In some embodiments, forming the actuation member includes forming a microwire through melt spinning. In some embodiments, forming the actuation member includes induction melting precursor rods to form an alloy melt and drawing a glass-coated microwire from the alloy melt. In some embodiments, forming the actuation member includes forming a Nickel-Manganese-Gallium microwire.

In some embodiments, altering the magnetic field applied to the actuation member includes changing the magnetic field strength. In some embodiments, altering the magnetic field applied to the actuation member includes changing the magnetic field direction.

Figure 1:
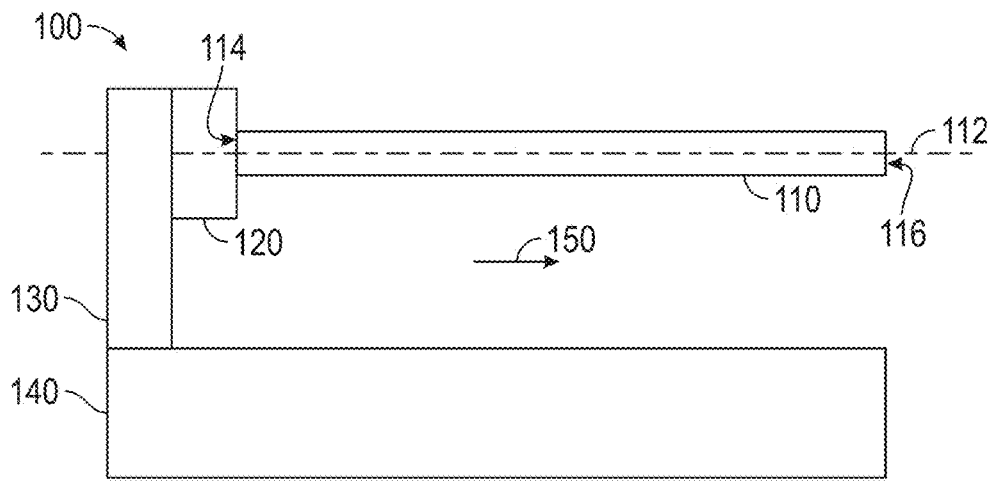
FIGS. 1-3 depict an embodiment of a system for actuation via magnetic torque driven deformation configured in different states.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

Figure 2:
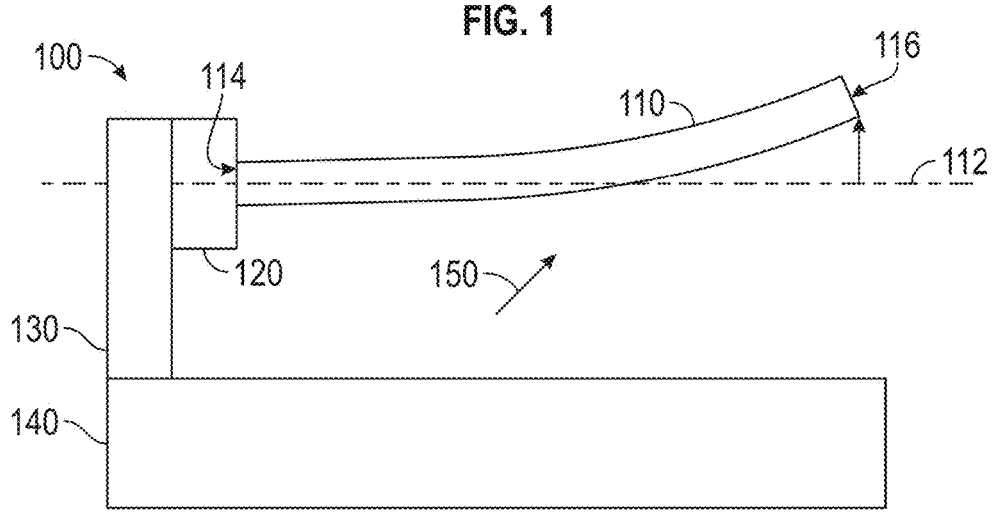
Figure 3:
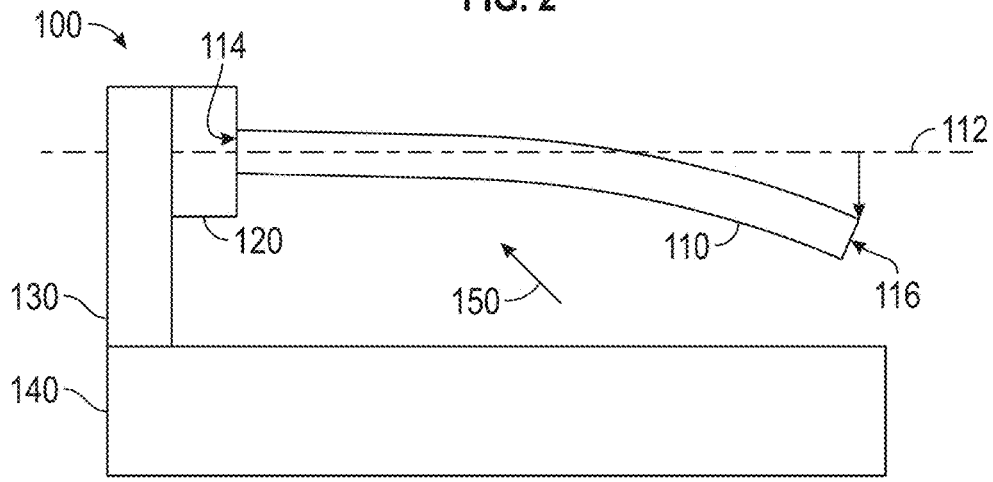

Referring to FIGS. 1-3, a system for actuation via magnetic torque driven deformation is depicted and generally designated 100. The system 100 may include an actuation member 110, an anchor 120, a body 130, and a magnetic field source 140.

The actuation member 110 may have a first end 114 and a second end 116. As depicted in FIG. 1, a length of the actuation member 110 may be greater than a width of the actuation member 110. For example, the actuation member may be a wire or a rod. In some embodiments, the wire or the rod may be cylindrical. In other embodiments, the wire or rod, may have non-circular cross-sections. The actuation member 110 may be susceptible to deformation in the presence of a magnetic field 150. For example, the actuation member 110 may include a magnetic shape memory alloy (MSMA). In some embodiments, the MSMA is a Nickel-Manganese-Gallium alloy as described herein.

The anchor 120 may retain the first end 114 of the actuation member 110. As such, the anchor 120 may fix a position of the first end 114 relative to a longitudinal axis 112 and relative to the body 130. The second end of the actuation member 110 may be unanchored or otherwise free to move laterally to the longitudinal axis 112.

The magnetic field source 140 may include any device capable of generating and altering the magnetic field 150. For example, the magnetic field source may include one or more permanent magnets as described in U.S. patent application Ser. No. 13/550,386 filed on Jul. 16, 2012 and entitled "Actuation Method and Apparatus, Micropump, and PCR Enhancement Method," now U.S. Pat. No. 9,091,251 hereby incorporated by reference in its entirety. As another example, the magnetic field source may include multiple electronic coils as described in U.S. patent application Ser. No. 14/493,674 filed on Sep. 23, 2014 and entitled "Electrically Driven Magnetic Shape Memory Apparatus and Method," hereby incorporated by reference in its entirety.

The operation of the system 100 is illustrated by FIGS. 1-3. When in an undeformed state, the length of the actuation member 110 may extend from the first end 114 and the second end 116 along the longitudinal axis 112, as depicted in FIG. 1. The magnetic field generator 140 may generate the magnetic field 150 and apply it to the actuation member 150. As depicted in FIG. 1, the magnetic field 150 may be parallel to the longitudinal axis 112, thereby causing no lateral deformation in the actuation member 110.

Referring to FIG. 2, the extent of deformation of the actuation member 110 may be adjusted. For example, the magnetic field 150 may be rotated relative to the longitudinal axis 112. Due to crystallographic twinning, as described herein, the actuation member 110 may deform in the presence of the magnetic field 150. The extent and direction of the deformation may be determined based on a magnitude and/or direction of the magnetic field 150. Further, because the deformation is due to crystallographic twinning, as opposed to the non-twinning deformation, which occurs in other ferromagnetic materials that are exposed to a magnetic field, the deformation of the actuation member 110 may be greater as compared to other ferromagnetic materials. Further, the direction of deformation of the actuation member may be determined based on the crystallographic orientation of the actuation member in conjunction with a direction of the magnetic field 150 as opposed to other ferromagnetic materials where the direction of deformation depends primarily on direction and magnitude of the magnetic field 150 regardless of the crystallographic orientation of the actuation member 110.

Referring to FIG. 3, the direction of the actuation member 110 may be adjusted. For example, the magnetic field 150 may be further rotated as compared to FIG. 2. The deformation of the actuation member 110 may switch to another direction in response to the further altered magnetic field 150.

The extent of deformation of the actuation member 110 may also depend on a state of the MSMA. For example, at a standard operating temperature, the MSMA may be martensitic. In a martensitic state, the deformation may be enhanced by crystallographic twinning as described herein. In some embodiments, a standard operating temperature is room temperature, which may include temperatures at or below about 25° C.

At a threshold temperature above the standard operating temperature, the MSMA may become austenitic. In an austenitic state, the actuation member 110 may be subject to non-twinning deformation. In the austenitic state, the deformation of the actuation member 110 may not be enhanced by crystallographic twinning. As such, the deformation of the actuation member 110 may be reduced and the actuation member 110 may function similarly to other ferromagnetic materials in the magnetic field 150. In some embodiments, the MSMA may be austenitic at or above a threshold that is about 10° C. higher than the standard operating temperature. For example, the threshold may be about 42° C.

At a Curie temperature associated with the MSMA, the actuation member 110 may be subject to no deformation due to the magnetic field 150. In some embodiments, the Curie temperature associated with the MSMA is about 82° C.

An advantage of the system 100 over the prior art is that by enabling the second end 116 of the actuation member 110 to move laterally to the longitudinal axis 112, a stroke of the actuation member 110 may be extended as compared to prior art MSMA actuation devices. Further, the deformation of the actuation member 110 may be more extensive as compared to actuation members that do not include an MSMA material due to crystallographic twinning. Another advantage of the system 100 is that the extent to which the actuation member 110 deforms may be temperature dependent based on the martensitic and austenitic phases of the MSMA. Other benefits and advantages of the system 100 may be apparent to persons of ordinary skill in the art having the benefit of this disclosure.

The system 100 may be incorporated into micro-actuators, sensors, magnetic cooling systems, energy harvesting devices, other actuation dependent devices, or combinations thereof, of which a few examples are provided as described herein with reference to FIGS. 4-7.

Figure 4:
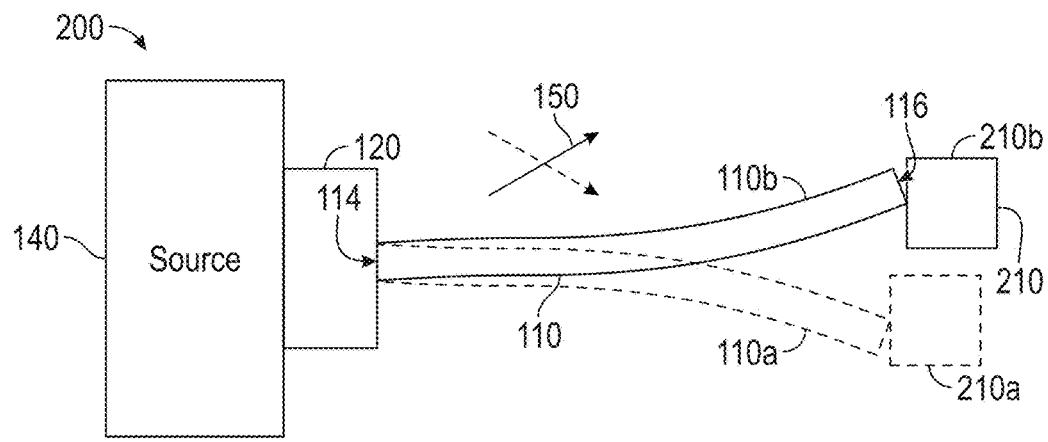
FIG. 4 depicts an embodiment of a system for actuation via magnetic torque driven deformation applied to an object.

Referring to FIG. 4, an embodiment of a system for actuation via magnetic torque driven deformation is depicted and generally designated 200. As depicted in FIG. 4, the magnetic field source 140 may be located at one end of the actuation member 110 as opposed to beneath the actuation member 110. Other configurations are also possible.

Based on a direction and magnitude of the magnetic field 150, the actuation member 110 may be in a first position 110a. Upon changing of the magnetic field 150, the actuation member 110 may be relocated to a second position 110b. Further, the actuation member 110 may attach to an object 210 at the second end 116 of the actuation member 110 while in the first position 110a to relocate the object 210 from a first position 210a to a second position 210b.

A lateral stroke value associated with the actuation member 110 may be calculated as a percentage of the length of the actuation member 110. As the actuation member deforms laterally, the stroke may be greater than 10%. For example, in some embodiments, the stroke associated with the actuation member 110 may approach 100%. Further, a work output of the deformation, e.g., work applied to the object 210, may be based on a shape anisotropy of the actuation member as opposed to being based primarily on the magnetocrystalline anisotropy energy as in typical MSMA-based actuators.

In some embodiments, the magnetic field source 140 may alter the magnetic field 150 by setting the magnetic field to a predetermined magnitude, a predetermined direction, or both. The predetermined magnitude and/or direction may result in a predetermined deformation of the actuation member 110. This enables the second end of the actuation member 110 to reach a precise and predetermined angle relative to the longitudinal axis 112 (shown in FIG. 1-3) of the actuation member 110. These embodiment may be used for angular actuation, which may be particularly applicable in optics and other application where precise angle actuation is desirable.

An advantage of the system 200 is that the object 210 may be precisely placed by the actuation member with a greater stroke as compared to actuation systems that do not include an MSMA. Further, with few movable parts, the system 200 may be reduced in size as compared to other actuation systems. Other benefits and advantages of the system 200 may be readily apparent to persons of ordinary skill in the art having the benefit of this disclosure.

Figure 5:
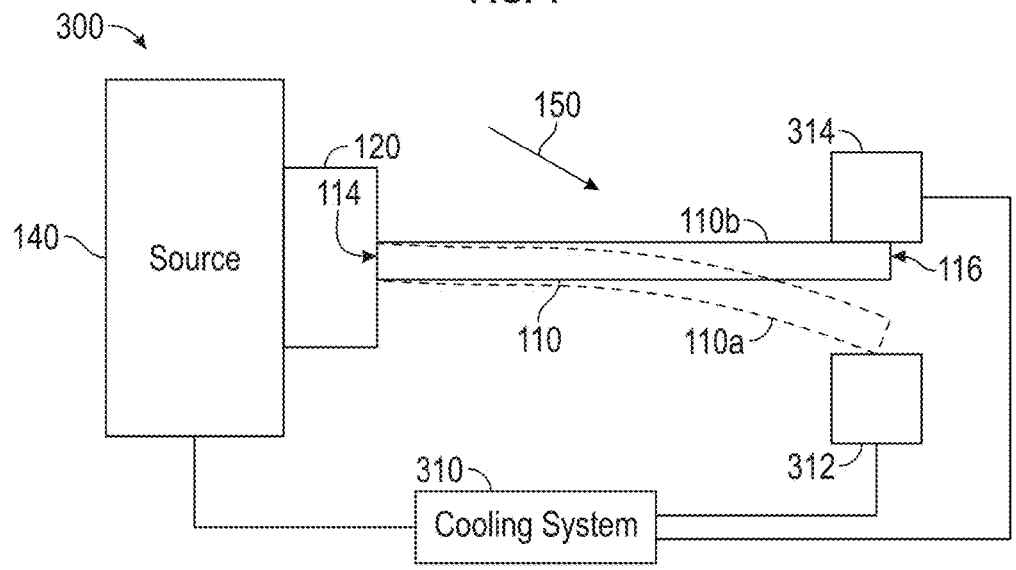
FIG. 5 depicts an embodiment of a system for actuation via magnetic torque driven deformation applied to a cooling system.

Referring to FIG. 5, an embodiment of a system for actuation via magnetic torque driven deformation is depicted and generally designated 300. The system 300 may include a cooling system 310 and an electrode 312.

The magnetic field source 140 may generate the magnetic field 150 to cause the actuation member 110 to deform to a first position 110a. At the first position 110a, the end 116 of the actuation member 110 may be in contact with the electrode 312. The contact may complete a circuit loop between the actuation member 110 and the cooling system 310. The cooling system 310 may be configured to remain in a standby mode, without performing cooling functions, while the circuit loop is complete. In some embodiments, the cooling system 310 may include a passive heat sink.

As the actuation member 110 heats up, a state of the actuation member 110 may change from a martensitic phase to an austenitic phases. When the actuation member 110 reaches an austenitic phase, deformation due to crystallographic twinning may decrease or may cease entirely. In response to the austenitic phase, the actuation member 110 may move to a second position 110b. In the second position 110b, the circuit loop may be broken. The circuit being broken may cause the cooling system to begin to function. In this way, the actuation member 110 acts as a sensor, breaking the circuit loop when a temperature of the actuation member 110 reaches a threshold temperature. In some embodiments, a second electrode 314 may be positioned such that a circuit may be closed when the actuation member 110 is in the second position 110b. In this way, the actuation member 110 acts as a sensor, closing the circuit loop when a temperature of the actuation member 110 reaches the threshold temperature. In some embodiments, both the electrodes 312, 314 may be present and positioned such that the electrode 312 closes a first circuit loop in the first position 110a and the second electrode 114 closes a second circuit loop in the second position 110b.

An advantage of the system 300 is that a temperature sensor may be constructed with fewer components and may be more scalable as compared to other sensor systems. Other benefits and advantages associated with the system 300 may be readily apparent to persons of ordinary skill in the art having the benefit of this disclosure.

Figure 6:
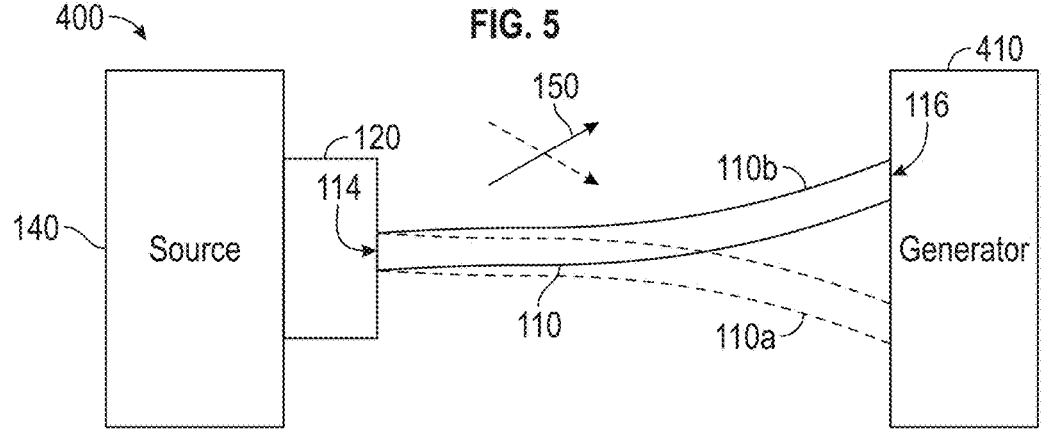
FIG. 6 depicts an embodiment of a system for actuation via magnetic torque driven deformation applied to an energy harvesting device.

Referring to FIG. 6, an embodiment of a system for actuation via magnetic torque driven deformation is depicted and generally designated 400. The system 400 may include a generator 410. This embodiment, may be used for harvesting energy associated with the magnetic field source 140.

The magnetic field source 140 may produce a periodic magnetic field 150 that alternates over time. The alternating periodic magnetic field 150 may cause an alternating deformation in the actuation member 110 that causes the actuation member 110 to oscillate between the first position 110a and the second position 110b. As the actuation member 110 oscillates, the generator 410 may convert the movement of the actuation member 110 to electrical energy. In that way, energy may be harvested from the magnetic field source 140.

Figure 7:
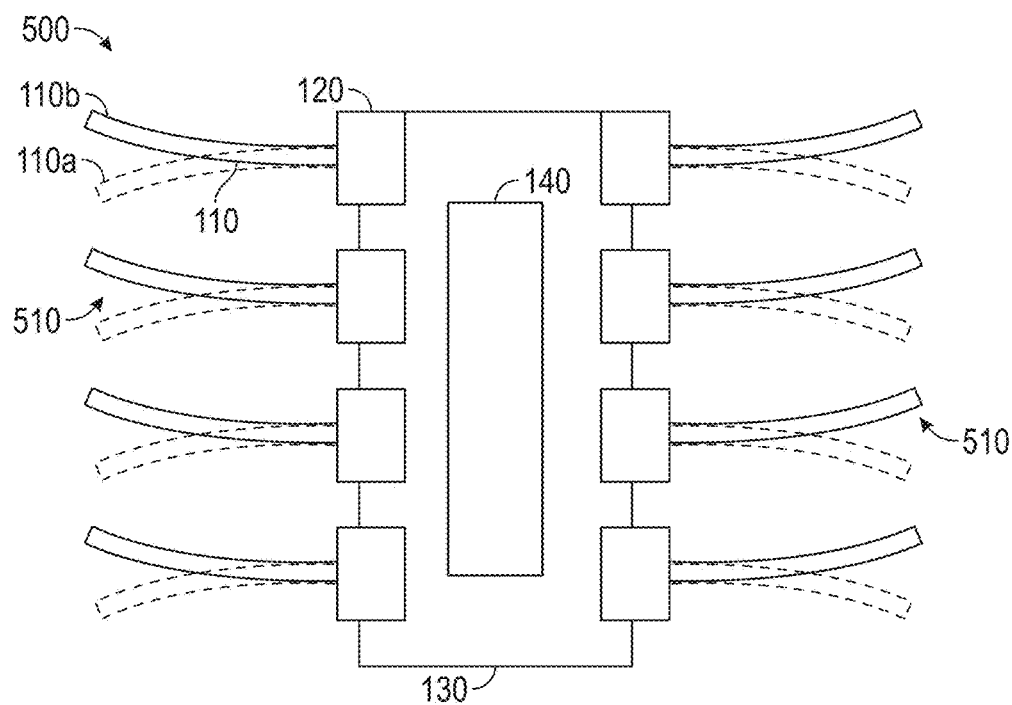
FIG. 7 depicts an embodiment of a system for actuation via magnetic torque driven deformation applied to a micropropulsion device.

Referring to FIG. 7, an embodiment of a system for actuation via magnetic torque driven deformation is depicted and generally designated 500. The system 500 may include a set of actuation members 510, which may include one or more actuation members 110. As depicted in FIG. 7, the set of actuation members 510 may be positioned around the body 130 on both sides. Even though FIG. 7 depicts the set of actuation members 510 as including eight actuation members, more or fewer actuation members may be included. Further, as depicted in FIG. 7, the magnetic field source 140 may be positioned within the body 130 as opposed to other embodiments were the magnetic field source 140 is coupled to an exterior of the body 130.

During operation, the magnetic field source 140 may produce a magnetic field and apply the magnetic field to the set of actuation members 510. Each actuation member of the set of actuation members 510 may deform such that the actuation member moves. For example, FIG. 7 depicts each actuation member moving from a first position, e.g., 110a, to a second position, e.g., 110b. The force caused by the deformation of the actuation member may be applied to a fluid surrounding the system 500. Applying the force to the fluid may invoke movement of the body 130 through the fluid. As such, the set of actuation members 510 may act as propellers that propel the system 500. Applying the force to the fluid may invoke movement of the fluid. As such, the set of actuation members 510 may act as a fan that stirs the fluid.

A benefit of the system 500 is that by using a magnetic field to deform the set of actuation members 510, the system may have fewer movable parts as compared to systems that employ other mechanisms for propulsion. As such, the system 500 may be employed in microscopic propulsion applications. The system 500 may also be employed in micro-ventilation, micro-cooling, micro-heating, and micro-stirring applications. Other benefits and advantages of the system 500 may be readily apparent to persons of ordinary skill in the art having the benefit of this disclosure.

Physical Principles of Operation

Magnetic Torque Driven Deformation is a mechanism to produce very large bending deformation in a magnetic material through the application of a magnetic field. Deformation strokes can be as large as the material itself (in the order of 100%). Local deformation may be achieved via a displacive mechanism such as crystallographic twinning or a displacive phase transformation. To exhibit this mechanism, the material may be ferromagnetic and possess a low stress barrier for the displacive deformation mechanism. We have demonstrated this mechanism with a Ni—Mn—Ga microwire. This mechanism can be used for microactuators. Microactuators allow for precise positioning of small objects, with size often in the submicron range. Micromachines also function as microactuators.

Material

Figure 8:
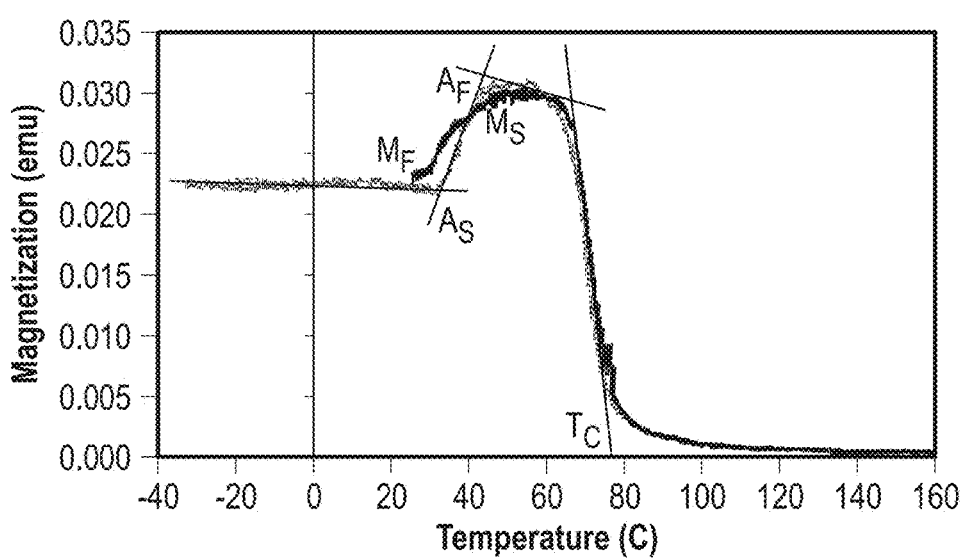
FIG. 8 is a chart depicting temperature dependence of magnetization of Ni—Mn—Ga in a low magnetic field upon heating and cooling.

We have demonstrated Magnetic Torque Driven Deformation at a Ni—Mn—Ga fiber. FIG. 8 depicts the magnetization of a Ni—Mn—Ga fiber exposed to a low magnetic field of 25 mT as a function of temperature. When cooling from high temperature, the Curie temperature $T_C$ marks the transition from paramagnetic ("non-magnetic") to ferromagnetic ("magnetic"). The four temperatures labeled $M_S$, $M_F$, $A_S$, and $A_F$ mark the hysteretic martensitic transformation. Above $A_F$, the material is fully austenitic (cubic). Below $M_F$, the material is fully martensitic (monoclinic). Between these two temperatures, the crystallographic state of the sample is a combination of these two phases (i.e. martensite and austenite), and details depend on the thermal history. As depicted in FIG. 8, below $M_F$ (about 25° C.), the material is completely martensitic and has a very low twinning stress (about 1 MPa or less). Above $A_F$ (about 42° C.), the material is completely austenitic and does not deform via a displacive mechanism. Above the Curie temperature $T_C$ (about 76° C.), the material is non-magnetic. In the martensite phase (i.e. below $M_F$), the material deforms under a very small stress by crystallographic twinning.

Mechanism

A magnetic material with Magnetization M, experiences a torque Θ in a magnetic field H:

$$\Theta = -dMH/d\varphi$$

where φ is the angle between M and H. For a rod with infinite magnetic anisotropy and magnetized along its axis, the equation becomes:

$$\Theta = MH \sin \varphi$$

When the rod is fixed on one end the torque, Θ, causes bending. The magnetic torque causes local stresses which are low compared to the yield stress (stress under which a metal deforms permanently) of known magnetic material such as iron, nickel, and cobalt. Thus, for such materials, magnetic-torque-induced bending is accommodated elastically and very small.

We propose here a mechanism which leads to very large and reversible bending deformation. Certain magnetic materials, for example MSMAs, deform under very low stress via crystallography twinning. The twinning shear, s, is the maximum shear strain accommodated by twinning and limits the total deformation, which is the twinning strain Et. For the ferromagnetic shape-memory alloy Ni—Mn—Ga with 10M martensite, $\varepsilon_t$, is about 6%.

Bending is an inhomogeneous deformation. The axis of a bent rod, which is also called the neutral line, is not deformed at all. At a distance z from the neutral line, the normal strain of a bent rod is z/R where R is the radius of curvature introduced by bending. Thus, the maximum strain occurs at the edge of the rod. Assuming twinning as deformation mechanism, the twinning strain marks the maximum strain and, thus, provides a lower limit $R_{min}$ for the radius of curvature:

$$R_{min}=D/2\varepsilon_t$$

where D is the diameter of the rod.

Proof of Concept

We produced a Ni—Mn—Ga fiber with diameter D=0.24 mm and length L=13.44 mm. A 6 mm long segment of the wire was exposed to a slowly and step-wise rotating magnetic field. Every 5°, the rotation was stopped and a picture of the wire was taken. (Effectively, we simultaneously rotated the wire and the camera in the static field of a large electromagnet.) The wire was increasingly bent as the magnetic field rotated away from the wire axis. When the angle between the magnetic field and the bent wire exceeded 90°, the wire flipped to the other side, such that the bending was reversed.

The flipping and bending direction results from two processes. First, the magnetic field component parallel to the wire axis reversed the sign of the magnetization. This reversal changed the sign of the magnetic torque (see the equations for Θ above). The reversal of the magnetic torque caused a reversal of the strain via twinning.

Figure 21:
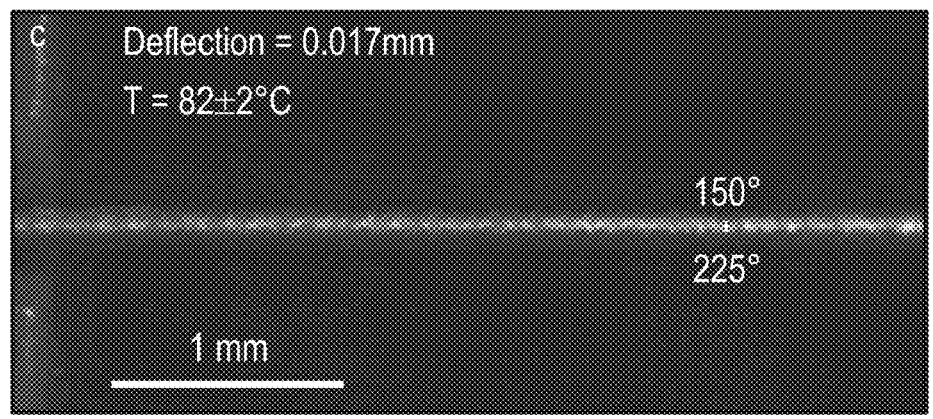
FIG. 21 is an overlay of two images depicting a Ni—Mn—Ga wire exposed to a rotating magnetic field at 21° C.

We performed this experiment at three temperatures, 21° C., 65° C., and 82° C. At 82° C., the sample is above the Curie Temperature Tc shown in FIG. 8. At this temperature, the magnetization is virtually zero and the rod does not experience a magnetic torque. FIG. 21 shows two overlaid images of the experiment performed at 82° C. The two frames show the maximum deflection to either side. The total stroke was 0.017 mm, which is less than ¹⁄₁₀th of the wire diameter.

Figure 20:
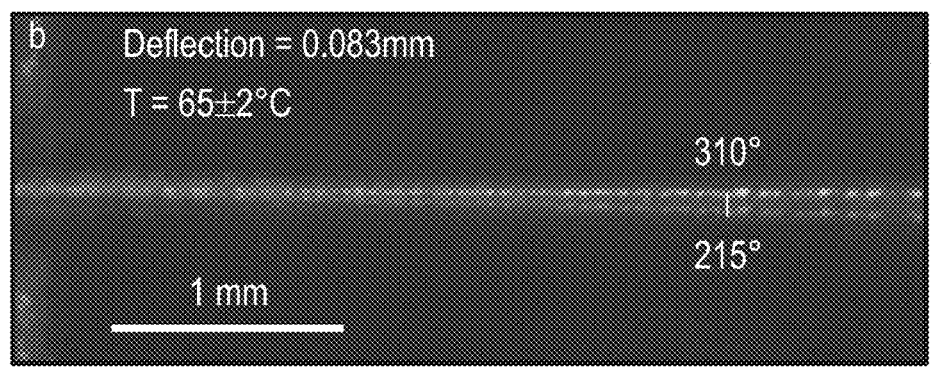
FIG. 20 is an overlay of two images depicting a Ni—Mn—Ga wire exposed to a rotating magnetic field at 65° C.

FIG. 20 shows two overlaid images representing the maximum deflections to either side when exposed to a rotating field at 65° C. At this temperature, the wire was magnetic and experienced a magnetic torque. However, the wire was in the austenite state and did not exhibit displacive deformation. The total stroke was 0.083 mm.

Figure 19:
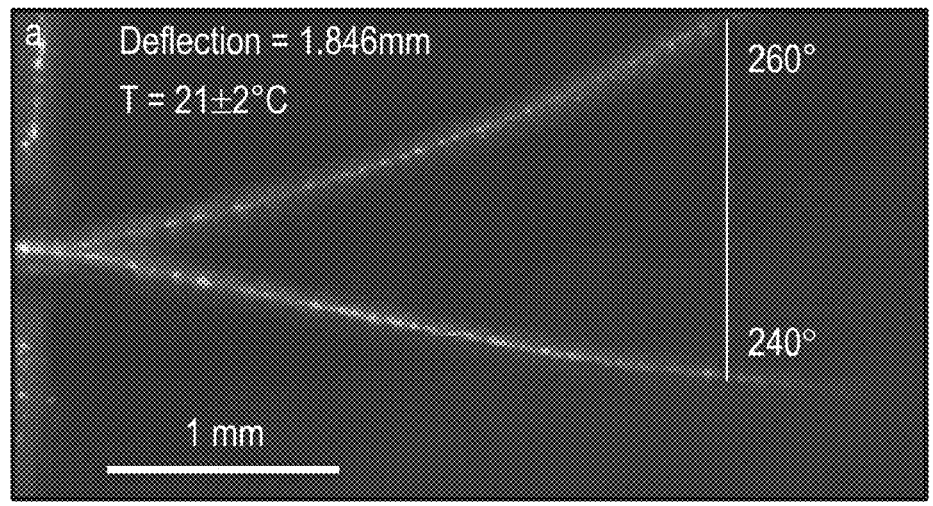
FIG. 19 is an overlay of two images depicting a Ni—Mn—Ga wire exposed to a rotating magnetic field at 82° C.

FIG. 19 shows two overlaid images representing the maximum deflections to either side when exposed to a rotating field at 21° C. At this temperature, the wire was magnetic and experienced a magnetic torque. The wire was also martensitic and deformed at low stress via twinning. The total stroke was 1.846 mm i.e. more than twenty times that detected at 65° C. FIGS. 19-21 are described further herein.

Distinction from Magnetic-Field-Induced Strain (MFIS)

Magnetic-field-induced strain (MFIS) is known as the longitudinal (normal) deformation displayed by magnetic shape-memory alloys. MFIS is carried by crystallographic twinning and produces an axial actuation stroke of up to the twinning strain (i.e. 6% for 10M Ni—Mn—Ga). The work output of MFIS is limited by the magnetocrystalline anisotropy energy.

Magnetic Torque Driven Deformation (MTDD) is a bending deformation and produces a lateral stroke. The stroke is in the order of the length of the rod, i.e. about 100%. The work output of MTDD is limited by shape anisotropy and increases with increasing aspect ratio (ratio of rod length and diameter).

Example Experimental Embodiment

Ni—Mn—Ga wires with sub-millimeter diameter, either as individual wires or as part of a 2D/3D wire assemblies, are promising candidates for actuators, sensors, magnetic cooling systems and energy harvesting devices. Here, we report on Ni—Mn—Ga microwires with 200-400 μm diameter fabricated by the Taylor method, as described herein, followed by annealing at 1050° C. for 1 h to achieve grain growth. The mechanical behavior of these oligocrystalline wires with bamboo grains was studied by tensile tests at room temperature. Wires with martensitic structure exhibit a very low Young's modulus of 5-8 GPa and superelastic behavior with twinning stresses of 22-30 MPa and recoverable strain of 3.5%, accumulating a plastic strain of ~0.6% over 8 consecutive 0-50 MPa mechanical loading cycles. A 1 T rotating field caused the wire to bend to a curvature corresponding to a surface strain of 1.5%. During a full-field revolution, the wire deflected back and forth twice when the field direction was approximately perpendicular to the average wire direction. This effect was attributed to magnetic torque induced twinning.

1. INTRODUCTION

The magnetic shape memory effect (MSME), magnetocaloric effect (MCE) and damping capacities of Ni—Mn—Ga alloys near the stoichiometric $Ni_2MnGa$ composition may be form the basis for novel actuators, sensors, magnetic cooling systems and energy harvesting devices. See Dunand, D. C. and P. Mullner, Size Effects on Magnetic Actuation in Ni—Mn—Ga Shape Memory Alloys. Advanced Materials, 2011. 23(2): p. 216-232. Monocrystalline Ni—Mn—Ga are capable of magnetic-field-induced strain (MFIS) as high as 10% by twin-boundary motion. See Sozinov, A., et al., Giant magnetic field induced strain in NiMnGa seven-layered martensitic phase. Applied Physics Letters, 2002. 80(10): p. 1746-1748.

However, the MFIS of polycrystalline Ni—Mn—Ga with fine grains and random textures is near zero because grain boundaries impede twin boundary movement or, equivalently, create strain incompatibilities between neighboring grains. See Lazpita, P., et al., Correlation between magnetization and deformation in a NiMnGa shape memory alloy polycrystalline ribbon. Sensor Letters, 2007. 5(1): p. 65-68. Recently, Dunand and Müllner proposed that large MFIS in polycrystalline Ni—Mn—Ga can be enhanced by growing the grains and/or shrink the sample so that the grain size becomes comparable to one or more characteristic sample sizes thus allowing strain incompatibilities in grains to relax at their free surfaces. This concept was first demonstrated in foams with oligocrystalline struts containing large bamboo grains with twins spanning the full width of the struts, where MFIS as high as 8.7% were measured. See Boonyongmaneerat, Y., et al., Increasing magnetoplasticity in polycrystalline Ni—Mn—Ga by reducing internal constraints through porosity. Physical Review Letters, 2007. 99(24) and Chmielus, M., et al., Giant magnetic field induced strains in polycrystalline Ni—Mn—Ga foams. Nature Materials, 2009. 8(11): p. 863-866.

Similarly, oligocrystalline Ni—Mn—Ga wires or ribbons with grain sizes similar to the wire diameter (bamboo structure) or the ribbon thickness were studied. Scheerbaum et al. fabricated melt-spun Ni—Mn—Ga fibers with bamboo grain structure and achieved ~1.0% MFIS measured from SEM image and confirmed by calculating strains in individual bamboo grains based on crystallographic orientation changes from a fiber (~2.8 mm) at room temperature under a magnetic field up to 2 T. See Scheerbaum, N., et al., Magnetic field induced twin boundary motion in polycrystalline Ni—Mn—Ga fibres. New Journal of Physics, 2008. 10.

In addition to the creation of bamboo grains with a reduced number of neighbors, crystallographic texture is another method to enhance MFIS by reducing incompatibilities between twins of neighboring grains that deform in similar orientations. Under a 1 T magnetic field, seven pieces of melt-spun Ni—Mn—Ga ribbons bonded by a cyanoacrylate adhesive in their thickness direction with a thickness of 0.12 mm and a width of 14 mm showed a contractive martensitic transformation strain of −0.46% upon cooling at 200 K from 300 K. See Guo, S. H., et al., Magnetic field induced strains of bonded Ni—Mn—Ga melt spun ribbons. Chinese Physics Letters, 2006. 23(1): p. 227-230. Each ribbon presented columnar crystallographic texture which was approximately parallel to their thickness direction. This increases the magnetocrystalline anisotropy of the sample and leads to a larger MFIS in its thickness direction than that of a single piece of melt-spun ribbon (~0.3%).

From the technological standpoint, there is interest in miniaturization of MSMA-based devices by using small MSMA particles, wires, ribbons, films, bilayers, multilayers, and pillars. See Varga, R., et al., Magnetic and structural properties of Ni—Mn—Ga Heusler-type microwires. Scripta Materialia, 2011. 65(8): p. 703-706. Ni—Mn—Ga microwires can be used within composites or constructed into 2D or 3D scaffolds by wire bonding. In order to make Ni—Mn—Ga more suitable for isothermal high frequency actuation and damping applications, Ni—Mn—Ga microwires with coarse grains could be embedded into a matrix directly as fibers or after being grounded into single crystal powders to develop smart composites. See Scheerbaum, N., et al., Textured polymer bonded composites with Ni—Mn—Ga magnetic shape memory particles. Acta Materialia, 2007. 55(8): p. 2707-2713 and Lahelin, M., Studies on Polymeric Composites with Ni—Mn—Ga Alloys and Carbon Nanotubes, 2011, Aalto University.

Melt spinning and the Taylor method have been used to fabricate Ni—Mn—Ga wires or ribbons. See Panda, A. K., et al., Magnetic transitions and structure of a NiMnGa ferromagnetic shape memory alloy prepared by melt spinning technique. Journal of Magnetism and Magnetic Materials, 2008. 320(17): p. L116-L120; Liu, J., et al., Influence of annealing on magnetic field induced structural transformation and magnetocaloric effect in Ni—Mn—In—Co ribbons. Acta Materialia, 2009. 57(16): p. 4911-4920; Llamazares, J. L. S., et al., Martensitic transformation in Ni50.4Mn34.9In14.7 melt spun ribbons. Journal of Physics D-Applied Physics, 2009. 42(4); Ochin, P., et al., Shape memory thin round wires produced by the in rotating water melt spinning technique. Acta Materialia, 2006. 54(7): p. 1877-1885; Chen, Y, et al., Shape memory and superelasticity in polycrystalline Cu—Al—Ni microwires. Applied Physics Letters, 2009. 95(17); Varga, R., et al., Studies of magnetic and structural properties of Ni—Mn—Ga Heusler type microwires. Journal of Optoelectronics and Advanced Materials, 2012. 14(3-4): p. 257-261.

Melt spinning has been applied to fabricate ferromagnetic shape memory Ni—Mn—Ga microfibers and a bamboo grain structure was achieved after annealing at 1100° C. for 2 h. However, the surface of melt spun wires is very irregular, which may lead to early fracture due to stress concentration. The Taylor method as applied to Ni—Mn—Ga microwire fabrication provides several advantages such as (i) wires are solidified within a glass sheath, which could reduce Mn and Ga evaporation during annealing at high temperatures, provides a smooth surface, as well as reduce corrosion which may be useful for bio-sensors (see Spottorno, G. R. M. M. J., Magnetic Sensors for Biomedical Applications in Magnetic Sensors—Principles and Applications, K. Kuang, Editor. 2012, InTech); (ii) it allows production of Ni—Mn—Ga wires as fine as ~44 μm with uniform circular cross-sections.

2. EXPERIMENTAL PROCEDURES 2.1 Ni—Mn—Ga Microwire Preparation

Ni—Mn—Ga wires with 150-400 μm diameters and a length of up to 90 mm were manufactured using a custom-built Taylor machine. The Taylor method is based on drawing a glass-coated metallic wire directly from the melt in a single operation and is reviewed in the following publications: Donald, I. W., Production, Properties and Applications of Microwire and Related Products. Journal of Materials Science, 1987. 22(8): p. 2661-2679 and Donald, I. W. and B. L. Metcalfe, The preparation, properties and applications of some glass-coated metal filaments prepared by the Taylor-wire process. Journal of Materials Science, 1996. 31(5): p. 1139-1149.

Ni—Mn—Ga precursor rods with a target composition of $Ni_{50\pm0.5}Mn_{28.6\pm0.3}Ga_{21.4\pm0.2}$ were prepared from Ni (99.99% purity, American Elements), Mn (99.9% purity, ESPI, cleaned with 1.3% nitric acid) and Ga (99.9999% purity, Atlantic Metals) shots using induction melting. A Pyrex tube (8 mm inside diameter and 10 mm outside diameter) with one end closed (Wilmad-LabGlass, softening point: 821° C.) was used. Pyrex tubes were used due to their compatibility with Ni—Mn—Ga in terms of chemical properties, viscosity, and melting temperature. A fine long glass filament was drawn from the bottom of the tube using an oxy-acetylene torch and it was attached to a pulley for subsequent wire drawing. The alloy rod (~8 mm in diameter, 2-3 mm in height, liquidus temperature of ~1130° C.) was placed inside the Pyrex tube which was flushed and kept under ~1 atm flowing argon, before being melted by induction heating. See Schlagel, D. L., et al., Chemical segregation during bulk single crystal preparation of Ni—Mn—Ga ferromagnetic shape memory alloys. Journal of Alloys and Compounds, 2000. 312(1-2): p. 77-85.

Once the melting was observed visually, its temperature was controlled ±10° C. by adjusting the power of the induction heater with the temperature monitored by a single color pyrometer (Model: PSC-CS-Laser-2MH, Process Sensors). Once the Pyrex tube got softened by thermal conduction from the Ni—Mn—Ga melt, the pulley with a diameter of 82 mm began rotating, with a drawing speed of 26-103 μm/s. The distance between the induction coil and the pulley, the drawing speed and the viscosities of the Pyrex tube and metallic melt all control the final diameter of the Ni—Mn—Ga Taylor wire. The drawn wire fell onto a sand bed acting as a cushioning and cooling media. The glass-coated Ni—Mn—Ga microwires were then encapsulated in a quartz capsule at low vacuum of ~50 Torr with Ti getters and subjected to heat treatments at 1050° C. for 1 h for grain growth and homogenization and 700° C. for 12 h for chemical ordering, followed by furnace cooling. The chemical ordering reduces structural and magnetic defects, which impede the motion of twin boundaries, in turn, increasing the WIS. See Richard, M. L., et al., Chemical order in off-stoichiometric Ni—Mn—Ga ferromagnetic shape-memory alloys studied with neutron diffraction. Philosophical Magazine, 2007. 87(23): p. 3437-3447. The glass cladding, which partially spalled off due to thermal shock upon rapid cooling after fabrication, was fully removed using 1600 grit sandpaper, instead of hydrofluoric acid which preferentially attacks Ga and alters the alloy composition of the Ni—Mn—Ga microwires.

Six Ni—Mn—Ga microwires were selected for further tests in this study. They are labeled S1 (diameter d=368±18 μm, length l=14 mm), S2 (d=210±10 μm, l=12 mm), S3 (d=210±12 μm and l=12 mm), S4 (d=280±12 μm, l=20 mm), S5 (d=249±13 μm, l=13 mm) and S6 (d=310±18 μm, l=3.56 mm). Tensile tests were conducted on wires S1, S2, S3 and S4. Wires S5 and S6 were used to demonstrate and analyze the magnetic field induced shape change. After mechanical and magneto-mechanical tests, short pieces (1-3 mm in length) were cut from wire W1, S3 and S5 for composition characterization and/or metallographic preparation. Full-length samples of wires (S1, S2, S3, S5 and S6) were tested in the Vibrating Sample Magnetometer (VSM) to determine the martensitic transformation temperature and Curie temperature. Additionally, X-ray diffraction (XRD) measurements of S1, S3, and S5 were collected on the full length of the wires to determine phase.

2.2 Composition, Microstructure, Phase and Thermal Properties

The composition of the Ni—Mn—Ga microwires was investigated by a Hitachi-3400 scanning electron microscope (SEM) equipped with an energy-dispersive X-ray spectrometer (EDX). A standard sample, whose composition was determined via chemical analysis, was used for calibration purposes. The composition was determined by averaging measurements from three different cross-sections of each specimen. The SEM was operated at a 25 kV accelerating voltage and a 10 mm working distance for the analysis.

Short S1 and S3 pieces with 1-3 mm length were mounted into longitudinal and radial cross sections, and etched with Kalling's reagent #2 (5 g $CuCl_2$+100 ml HCl+100 ml Ethanol) following a final polishing with 0.06 μm colloidal silica.

The martensite structures of wires (S1, S3, and S5) were determined using a Bruker AXS D8 Discover X-Ray Diffractometer (XRD) with a Cu K-alpha source and an area detector. For phase analysis, the angles of the incident beam and of the detector center were simultaneously increased in increments of 5° so that the 2θ angle covered the range from 40 to 90°. The sample was placed on an acrylic sample holder and the sample stage was moved in X and Y such that the beam covered the entire sample while diffracted intensity was collected for 30 seconds. This procedure was repeated for different sample orientations varying by approximately 90 degrees.

The martensitic transformation ($T_M$), taken as the mean of the austenite start temperature ($A_s$) and martensite finish temperature ($M_f$), and the Curie temperature ($T_C$) of the wires were determined using a MicroSense Model 10 Vibrating Sample Magnetometer (VSM). During VSM experiments, the wire was mounted perpendicular to the applied magnetic field and magnetization was measured as a function of temperature with a heating rate of 6 K/min and a cooling rate of 4 K/min.

2.3 Tensile Tests

Figure 10A:
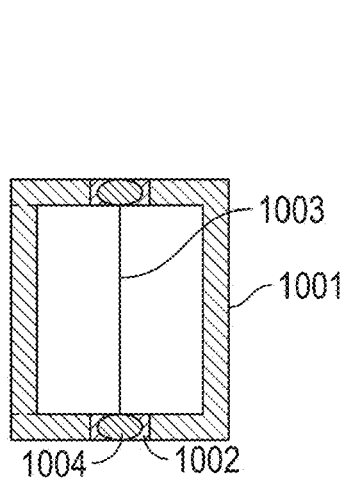
FIGS. 10A-10B depict an embodiment of a cardboard frame technique for tensile testing of a single Ni—Mn—Ga microwire.
Figure 10B:
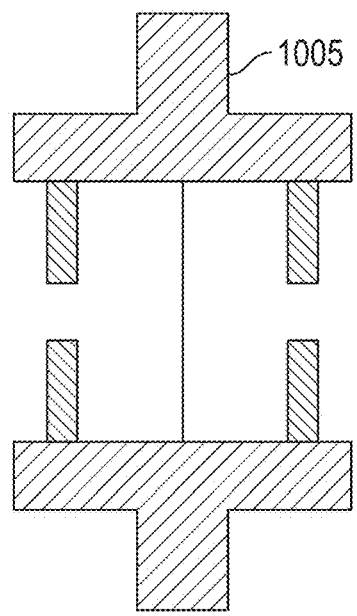

Referring to FIGS. 10A and 10B, wires S1-S4, depicted in FIG. 10A as a wire 1003, were subjected to uniaxial tensile tests following the ASTM C1557-03(08) standard at room temperature, using a TA Instruments RSA3 Dynamic Mechanical Analyzer (DMA). See C1557, A.S., Standard Test Method for Tensile Strength and Young's Modulus of Fibers, 2003, ASTM International: West Conshohocken, Pa. To avoid premature failure of the wire 1003, i.e., damage in the gripping area or breaking during gripping due to the alloy brittleness, a mounting tab made of cardboard 1001 with a center hole of fixed gauge length (7.4, 5.8, 6.1 and 13 mm for wire W1, W2, W3 and W4, respectively) was used to support the wires while installing them into the tensile testing machine. Two rectangular G-10 epoxy/glass composite thin plates 1002, ca. 5×5×1 mm$^3$ in dimensions (purchased from McMaster) were attached to the cardboard mounting tab 1001 using double-sided tape. The two ends of the wire 1003 were fixed on the plates using cyanoacrylate glue 1004. After the glue 1004 cured, the wire 1003 was embedded within the transparent glue 1004 and, therefore, would not be damaged when the whole frame was clamped into the tensile tester by the "T"-shaped fixture 1005. After the specimen was mounted in the DMA, the cardboard mounting tab 1001 was cut in two places, leaving the wire 1003 free to be tested.

The uniaxial tensile force was applied by a microforce testing system and gave accurate stress measurement with a resolution of 0.9-3 kPa for wire diameters of 210-370 μm. The cross-head displacement was measured by a high resolution linear optical encoder with a strain resolution of 4-9×10$^{-4}$% for a gauge length of 5.8-13 mm. The TA Orchestrator software was used to control the system and collect the testing data. Before testing the Ni—Mn—Ga wire samples, Arcor bare copper wires (99.99% purity) were used for calibration to determine the compliance of the load train, i.e. machine, superglue, tabs, which was used to correct the sample displacement. The strain-controlled tensile tests were carried out at room temperature at a constant strain rate of 1 μm/s. At the beginning of all cycles, a 2-5 MPa pretension was applied to straighten Samples S1-S4.

2.4 Magneto-Mechanical Experiments

Rotating field experiments were performed with wires S5 and S6 in an optical magneto-mechanical device. Referring to FIGS. 17 and 18A-D, a plastic tube 130 is inserted in an electromagnet, depicted in FIGS. 18A-18D, such that the tube axis lies parallel between the pole pieces, i.e. perpendicular to the magnetic field direction. At one end of the tube, a wire sample 110 is mounted perpendicularly to the tube axis. The wire 110 is glued at one of its ends to a sample holder 120, which is rigidly attached to the tube. On the other end, the wire 110 is free. A camera and illumination assembly (not shown) is rigidly mounted to the opposite end of the tube such that the wire is in the field of view of the camera. Tube and camera are attached to a gear and motor and can be rotated with a stepper motor at 1° increments. Thus, while tube, sample, and camera rotate counter-clockwise around the tube axis, the camera records a wire at rest in a clockwise rotating field. The field direction changes gradually from parallel to the wire axis (0°) to perpendicular to the wire axis (90°) back to parallel (180°) and again to perpendicular (270°) and finally to parallel (360°). In the following description, we discuss the experiment from the camera's coordinate system, which rotates with respect to the laboratory coordinate system.

A magnetic field of 1 T was applied parallel to the wire axis. The field was then rotated clockwise and 73 images were taken of the wire in 5° increments from 0 to 360°. For wire S5, the first rotating field experiments was performed at 22±2° C. The temperature was then raised first to 65±2 (above $A_f$ but below $T_C$) and then to 85±2° C. (above $T_C$): at each temperature, a 360° rotating field experiment was performed.

While the magnetic field was rotated at room temperature, the wire 110 gradually bent. At a field angle of about 70°, the wire 110 suddenly deflected to bend in the opposite direction. In a second experiment, the field was rocked in 1° increments between 65° and 120° at room temperature (22±2° C.).

3. RESULTS AND DISCUSSION

3.1 Superelastic Wires S1 and S2
3.1.1 Microstructure

Figure 9:
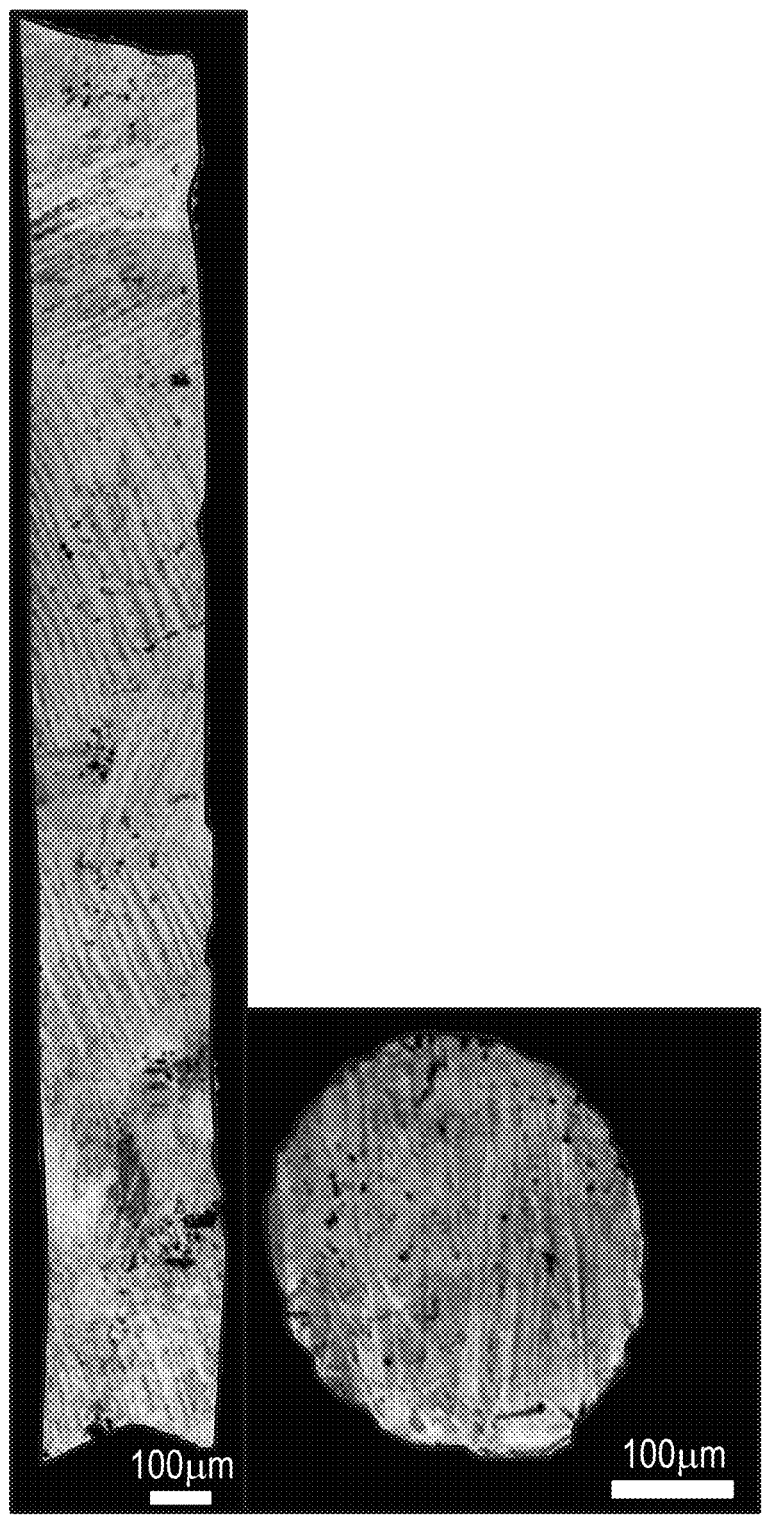
FIG. 9 is an image depicting a polished and etched longitudinal cross-section of a wire showing two single twin variants spanning across the whole wire and a posiched and etched transversal cross-section of a wire showing two single twin variants spanning across the whole wire.
Figure 12:
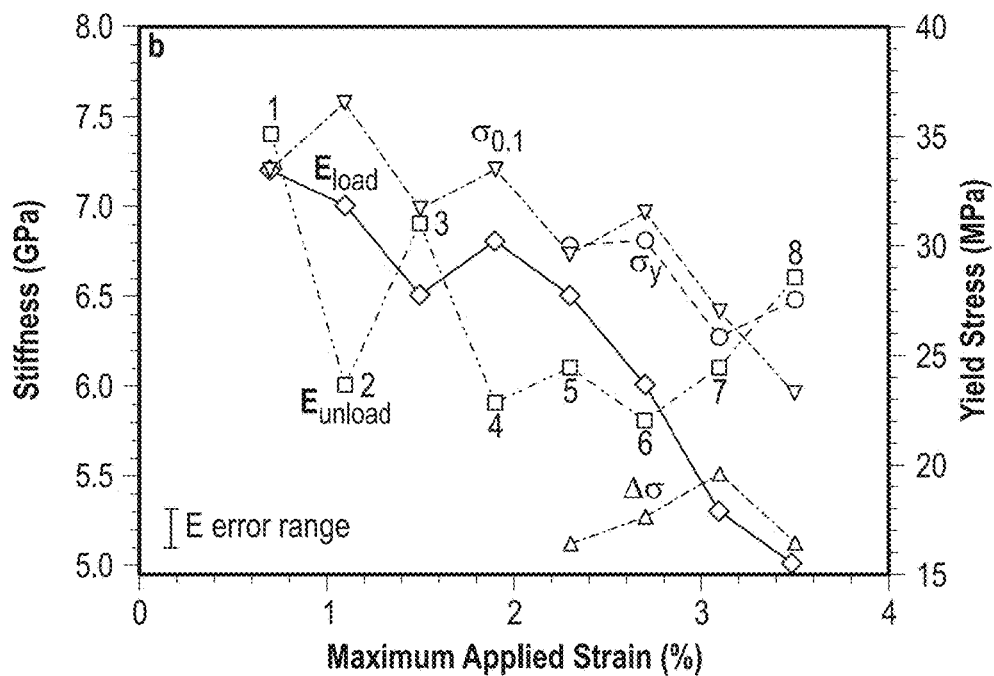
FIG. 12 is a chart depicting Young's modulus during loading and unloading and yield stresses for each cycle depicted in FIG. 11.

FIG. 9 depicts cross sections of wire S1 along its longitudinal and radial directions. As depicted in FIG. 9, two single twin variants span across the whole wire cross section at the right side, illustrating that a bamboo grains structure was achieved after annealing the Taylor wire, whose as-solidified grain structure is expected to be fine due to its rapid cooling from the liquid phase. The grain size is estimated to be in the range of 100-400 µm, much larger than the ~10 µm grain size of the as-solidified wires. The fully martensitic structure observed in FIG. 9 indicates that the austenite/martensite transformation temperatures are above 150° C., which is the upper boundary of VSM temperature measurement range. The W1 wire composition $Ni_{54.1\pm0.3}Mn_{26.2\pm0.5}Ga_{19.7\pm0.3}$ as listed in the table below, shows the composition to be enriched in Ni (by ~4 at,%) and depleted in Mn and Ga (each by ~2 at. %) as compared to the precursor rods. X-ray scans revealed a tetragonal non-modulated (2M) structure with lattice parameters a=0.549±0.001 nm and c=0.651±0.001 nm. The loss of Mn and Ga most probably occurred while the alloy was molten, as a result of the high vapor pressure of these elements. As described in Ma, Y. Q., et al., Microstructure and high-temperature shape-memory effect in $Ni_{54}Mn_{25}Ga_{21}$ alloy: Transactions of Nonferrous Metals Society of China, 2006. 16(3): p. 502-506, an alloy with similar compositions ($Ni_{54}Mn_{25}Ga_{21}$) was reported to have a martensitic finish temperature of 238° C. above its Curie point.

unloading. The superelastic recoverable strain for this wire increases from ~0.64% for the first loop with the lowest maximum stress of 34 MPa, to ~3.5% for the last loop with the highest maximum stress of 53 MPa. At the lowest stresses in each loop, a linear behavior is observed. Assuming that this represents elastic behavior without superelastic stress induced transformation, the slope of this early branch of the curves represent the Young's moduli. These are plotted as a function of maximum applied strain with loop number marked in FIG. 12, and show a monotonically decreasing trend from 7.2±0.1 GPa for the first loop to 5.0±0.1 GPa for the last loop. Young's modulus of Ni—Mn—Ga could change from 2-60 GPa due to the different original phase and phases formed by stress-induced phase transformations. See Chernenko, V. A., et al., Premartensitic phenomena and other phase transformations in Ni—Mn—Ga alloys studied by dynamical mechanical analysis and electron diffraction: Acta Materialia, 2002. 50(1): p. 53-60; Chernenko, V. A., et al., Sequence of martensitic transformations in Ni—Mn—Ga alloys: Physical Review B, 1998. 57(5): p. 2659-2662; and Peng, Z. M., et al., Internal friction and modulus changes associated with martensitic and reverse transformations in a single crystal Ni48.5Mn31.4Ga20.1 alloy: Journal of Applied Physics, 2004. 95(11): p. 6960-6962.

The Young's modulus of a single crystal Ni—Mn—Ga below 10° C. from its $M_f$ is 5-15 GPa. The low Young's modulus of wire S1 is in agreement with its martensitic phase determined by XRD, as shown in the above table. The modulus change from loop to loop may indicate the presence of stress-induced inter-martensitic transformations which were described in the high temperature Ni—Mn—Ga alloy and mimic elastic recovery via transformation-induced recovery during unloading. The establishment of an orientation of compliant grains during the load-unload loops may also result in the Young's modulus change. For stresses above ~35 MPa, the curves show an inflection, entering a second linear regime of where stress increases more slowly with strain. This region is typical of superelasticity, where stress induced martensite occurs. Its onset, measured as a 0.1% offset yield strength during loading, $\sigma_{0.1}$, and plotted for all of the cycles in FIG. 12 decreases from 36 to 23 MPa with increasing cycle number. The slope of the superelastic region however decreases steadily with increasing cycle number, an effect reported as training in various shape-memory alloys and probably related to the selection of martensitic variants that twin at lower stress than others.

| Wire | Composition (at. %) | | | Transformation temperature by VSM (C.) | | | | | Crystal structure by XRD |
|------|------|------|------|------|------|------|------|------|------|
| | Ni | Mn | Ga | $A_s$ | $A_f$ | $M_s$ | $M_f$ | $T_c$ | |
| S1 | 54.1 ± 0.3 | 26.2 ± 0.5 | 19.7 ± 0.3 | >150 | >150 | >150 | >150 | 83 ± 1 | M |
| S2 | 63.3 ± 5.9 | 17.9 ± 0.4 | 18.9 ± 0.6 | <−30 | <−30 | <−30 | <−30 | 6 ± 3 | Not Measured |
| S3 | 56.8 ± 0.2 | 15.3 ± 0.2 | 27.9 ± 1.0 | <−30 | <−30 | <−30 | <−30 | 8 ± 3 | A |
| S5 | 53.3 ± 0.7 | 23.6 ± 0.6 | 23.1 ± 0.4 | 32 ± 1 | 43 ± 2 | 43 ± 2 | 28 ± 2 | 77 ± 1 | Not measured |
| S6 | 53.3 ± 0.7 | 23.6 ± 0.6 | 23.1 ± 0.4 | 12 ± 5 | 21 ± 2 | 21 ± 2 | 10 ± 2 | 96 ± 1 | Not measured |

3.1.2 Tensile Properties

Figure 11:
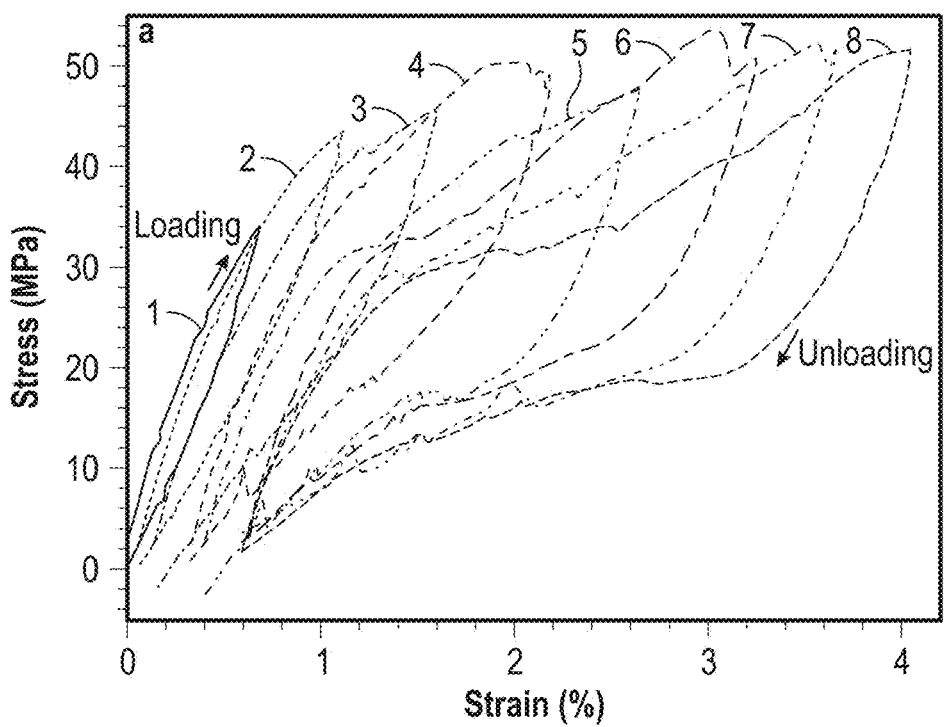
FIG. 11 is a chart depicting experimental stress strain curves for an embodiment of a Ni—Mn—Ga wire at room temperature.
Figure 13:
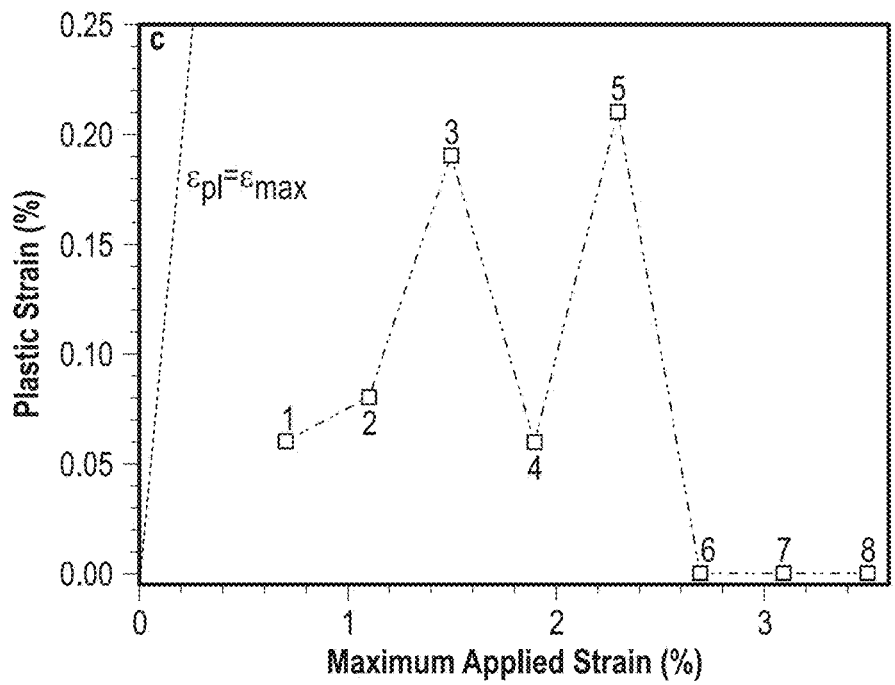
FIG. 13 is a chart depicting plastic strain as a function of the maximum strain applied for each cycle depicted in FIG. 11.

FIG. 11 shows a series of tensile stress-strain curves for wire S1, for eight load-unload loops where the maximum strain was increased from 0.7 to 3.5% at ambient temperature. The stress-strain curves exhibit the characteristic shape of superelastic materials, with a hysteresis loop on unloading where the strain is near fully recovered after each On unloading, a first linear region correspond to elastic unloading of the martensite, with a slope corresponding to the Young's modulus, which is between 5.5 and 7.5 GPa, within error of the loading value. A superelastic region follows upon further unloading, at stresses lower than the one on loading, indicating that the detwinning of the martensite upon loading is reversible. The stress hysteresis width in the superelastic range, $\Delta\sigma$, is shown as the difference between the upper plateau stress and the lower plateau stress in FIG. 12 and it remains relatively constant at 18±2 MPa. Finally, FIG. 13 shows, as a function of the maximum strain for each cycle, the residual plastic strain at the end of each cycle. This unrecoverable strain tends to increase in the first five loops, and then drops to zero in the last three. The dashed line denotes the condition where $\varepsilon_{pl}$ equals $\varepsilon_{max}$, which is when the strain recovery rate is 0%. It is apparent that shape recovery is high, between 87.3% for cycle 3 and 100% for cycles 6-8. After cycle 8, wire S1 was broken while uninstalling from the instrument.

Figure 14:
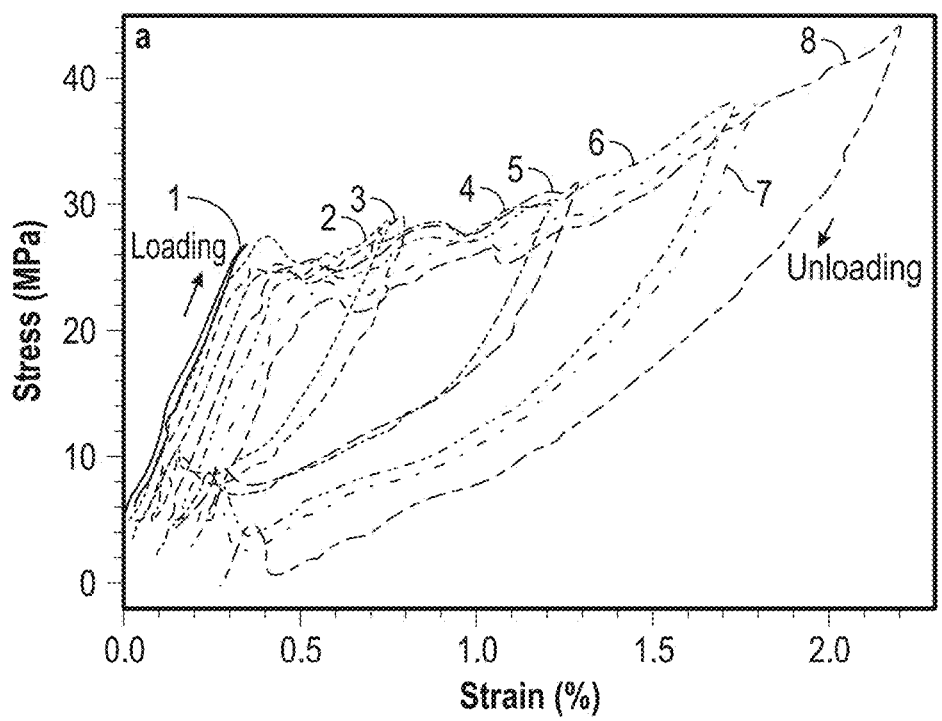
FIG. 14 is a chart depicting stress strain curves for another embodiment of a Ni—Mn—Ga wire at room temperature.

The superelastic behavior was also observed in wire S2. Its tensile stress-strain curves are shown in FIG. 14. The maximum strain was increased from 0.4% to 2.0% at ambient temperature over 8 load-unload loops. The superelastic recoverable strain for this wire increases from ~0.2% for the first loop with the lowest maximum stress of 27 MPa, to ~1.88% for the last loop with the maximum stress of 44 MPa. At the end of unloading at very low applied stress, a small stress peak was repeatedly observed for all cycles (except cycles 1 and 2 with low maximum strain) indicating that the wire undergoes contraction more rapidly than the instrument is reducing strain. All peaks and steps in FIG. 11 and FIG. 14 may be explained by the occurrence of intermartensitic transformations on unloading. See Chernenko, V. A., et al., Stress-temperature phase diagram of a ferromagnetic Ni—Mn—Ga shape memory alloy: Acta Materialia, 2005. 53(19): p. 5071-5077.

Figure 15:
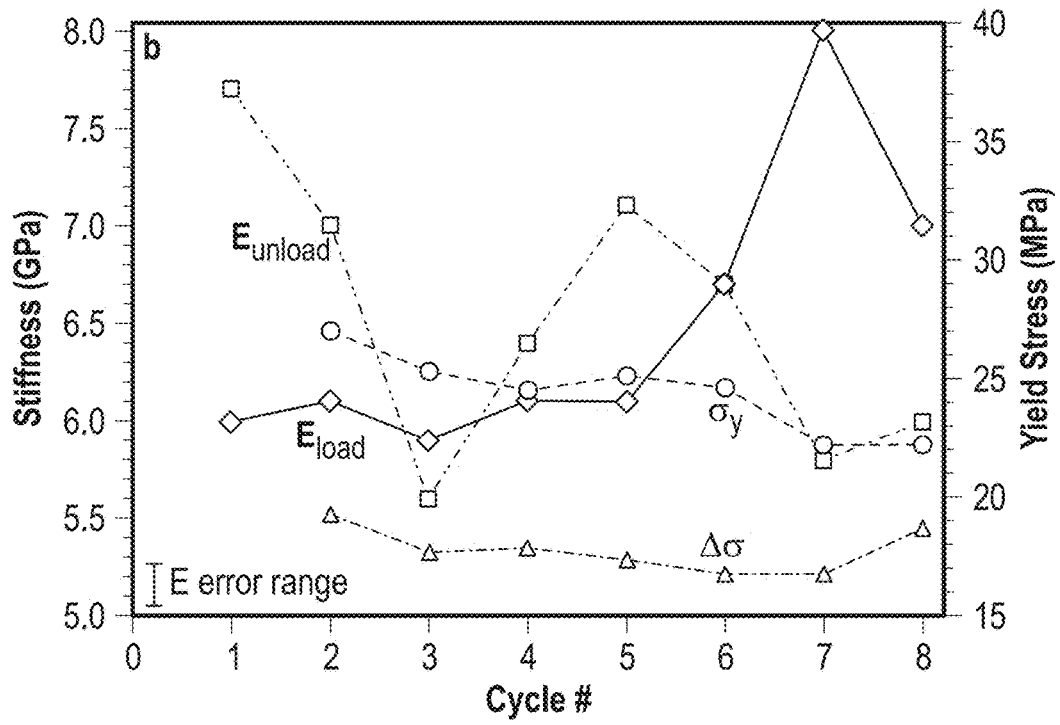
FIG. 15 is a chart depicting Young's modulus during loading and unloading and yield stresses for each cycle depicted in FIG. 14.

The Young's moduli are plotted as a function of maximum applied strain in FIG. 15. During loading, the Young's modulus is stable in the first 5 loops (~6 GPa) and increases to as high as ~8 GPa for cycle 7. The twinning stress, $\sigma_y$, i.e., the stress sufficient to reorient twin variants, decreases from 27 to 23 MPa with increasing cycle number, as shown in FIG. 15, illustrating mechanical training in wire S2.

Figure 16:
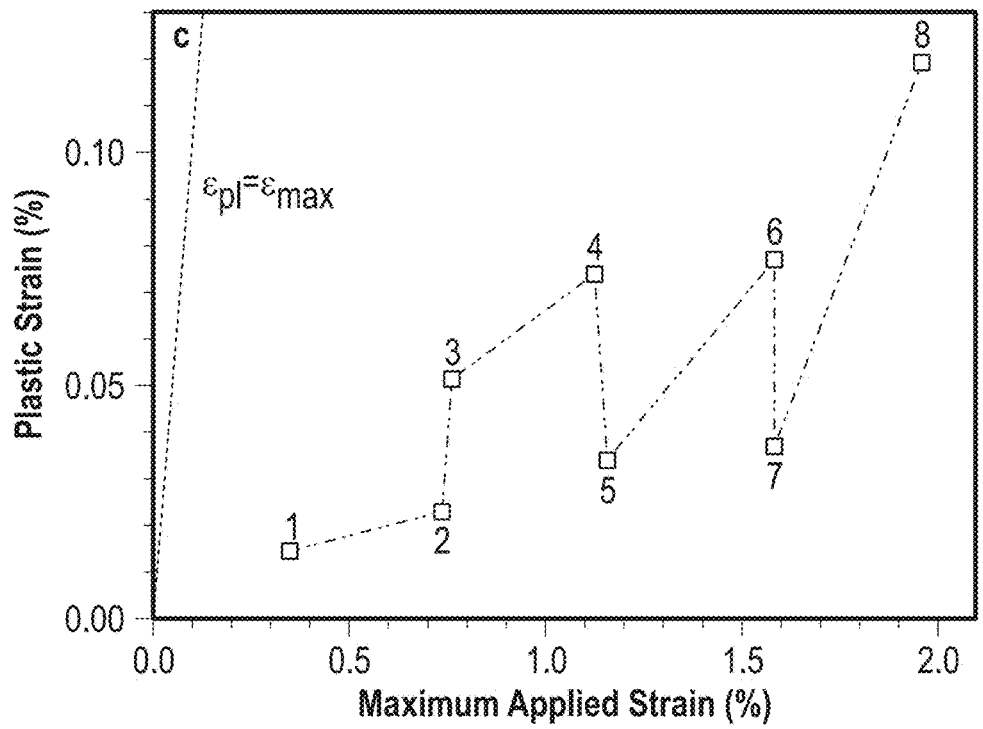
FIG. 16 is a chart depicting plastic strain as a function of the maximum strain applied for each cycle depicted in FIG. 14.
Figure 17:
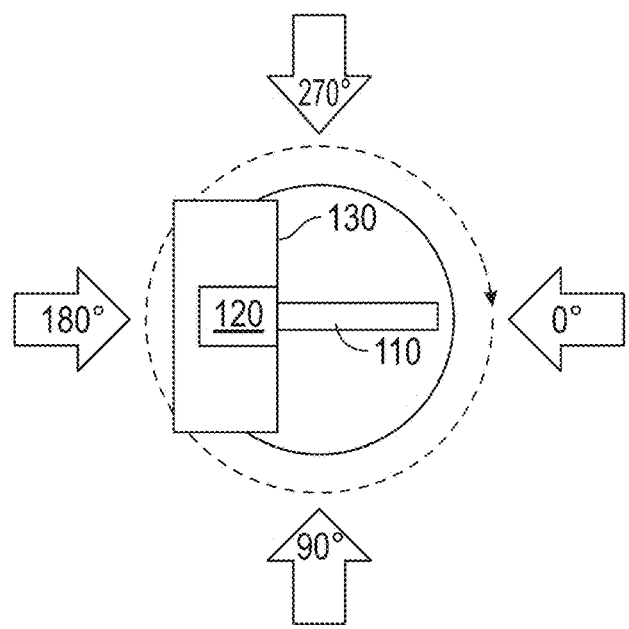
FIG. 17 depicts an embodiment of a system for performing rotating field experiments on an embodiment of a Ni—Mn—Ga wire.
Figure 18A:
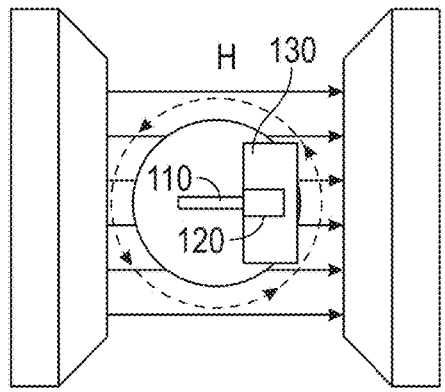
FIGS. 18A-18D depict different phases of an embodiment of a rotating field experiment.
Figure 18B:
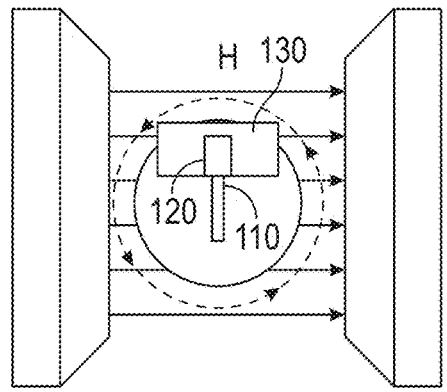
Figure 18C:
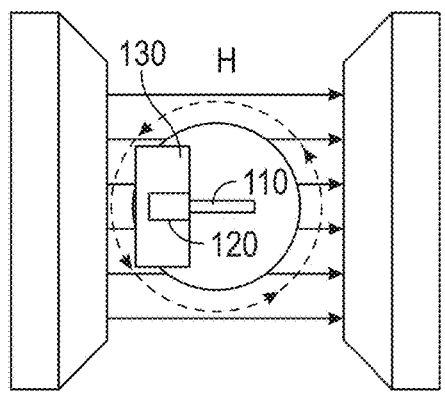
Figure 18D:
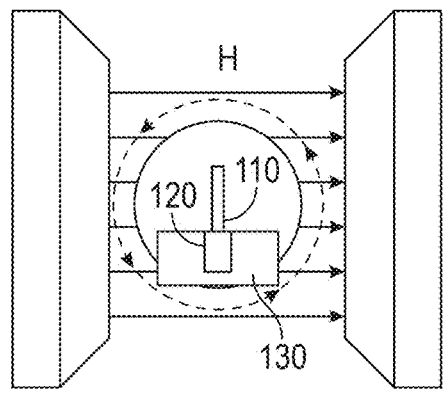

The Young's modulus during unloading ranges between 5.5 and 7.8 GPa. The stress hysteresis width in the superelastic range, $\Delta\sigma$, is shown in FIG. 15 and it also remains constant at 17.5±1 MPa. Finally, FIG. 16 shows, as a function of the maximum strain for each cycle, the residual plastic strain at the end of each cycle. The shape recovery is high, between 93% for cycle 3 and 78% for cycle 7. Wire W2 was fractured at the 9th loop at the strain of ~1.1% with a stress of 25 MPa.

Tensile tests have been conducted using $<001>_A$-oriented high temperature Ni—Mn—Ga single crystals with martensitic transformation temperatures of ~312° C. and obtained multistep superelastic strain of about 9% at ~320° C. See Chernenko, V. A., et al., Giant two-way shape memory effect in high-temperature Ni—Mn—Ga single crystal: 3rd International Symposium on Shape Memory Materials for Smart Systems/E-Mrs 2010 Spring Meeting, 2010. 10: p. 94-98. The corresponding Young's modulus was ~15 GPa and their highest stress ~180 MPa. Recently their group estimated martensitic and intermartensitic transformations from the standpoint of elastic modulus dependence on temperature. The quasi-equilibrium stress-temperature phase diagrams of the $L2_1$-5M, 5M-7M and 7M-2M phase transitions were also compared with thermodynamic estimations and ab-initio calculations and found to be in agreement. See Besseghini, V. A. C. E. V. J. M. B. T. K. T. F. T. T. S., Peculiarities of Superelastic Tensile Behavior of Ni—Mn—Ga and Ni(Co)—Fe—Ga Single Crystals, 2013. Similarly, the large superelasticity of wire S1 and S2 may be attributed to stress-induced martensitic twin variants reorientation during loading and intermartensitic transformations during unloading which leads to large strains without fracture due to the oligocrystalline structure in wire samples, which reduces incompatibility strains between neighboring grains. In-situ x-ray diffraction during tensile tests could be carried out for phase evolution exploration but is outside the scope of this paper.

3.2 Rotating Field Experiments

For the rotating field experiment performed at room temperature, starting at a field angle of 0°, which is pointing to the left in FIG. 19, the wire S5 was almost straight. Upon field rotation (clock wise), the wire slowly bent into the field direction, i.e. its free end tipped downwards. At an angle of 110°, the wire suddenly deflected to the opposite direction, i.e. with its free end pointing upwards. The wire then slowly bent again in the field direction until the field angle reached 290° when the wire deflected again to the opposite direction. Upon further field rotation up to 360° the wire continued bending slowly in the field direction. Thus, the bending response repeated twice during one revolution of the magnetic field. Wire S6 displayed a similar bending behavior.

The deflection of the wire was evaluated at a constant position 3 mm away from the fixture (indicated with vertical lines in FIGS. 19-21). The maximum deflection was were significantly reduced when the experiments were performed at higher temperature. At 65 and 85° C., the maximum deflections were 0.083 and 0.017 mm, as compared to 1.846 mm at 21° C. where the wire was martensitic. The magnetic field exerted a torque $\Theta=\mu_0 MHV \sin\varphi$ on the wire where M and H are saturation magnetization and magnetic field magnitude, V is the volume, and $\varphi$ is the field direction, with a maximum of about 10 mNm. The wire switched position abruptly when the magnetic field was approximately perpendicular to the average wire direction, i.e. when the torque approached the maximum value. For a round bar with diameter d under bending, the maximum axial normal stress is $\sigma_{max}=32\Theta/\pi d^3$, which exceeds 100 MPa in the present situation. This stress is much larger than the twinning stress and is expected to causes the wire to bend plastically by twinning. Wire bending causes an axial surface strain $\varepsilon=d/2R$, where R is the radius of curvature. The maximum deflection of 1.846 mm corresponds to a radius of curvature of 8 mm, leading to a strain at the outer surface of about 1.5%.

Referring to FIG. 20, at 65° C., the wire was austenitic and just below its Curie temperature, where the saturation magnetization is much reduced. The resulting local stresses were not sufficient to cause stress-induced martensite (compare with FIG. 19) and the wire thus bent elastically. A deflection of 0.083 mm corresponds to a strain of ~0.1% at the wire surface which is expected to be accommodated elastically. Referring to FIG. 21, at the higher temperature, 82° C., the austenitic wire was paramagnetic. The magnetic-field-induced torque was thus negligible and, as expected, almost no bending occurred.

Figure 22:
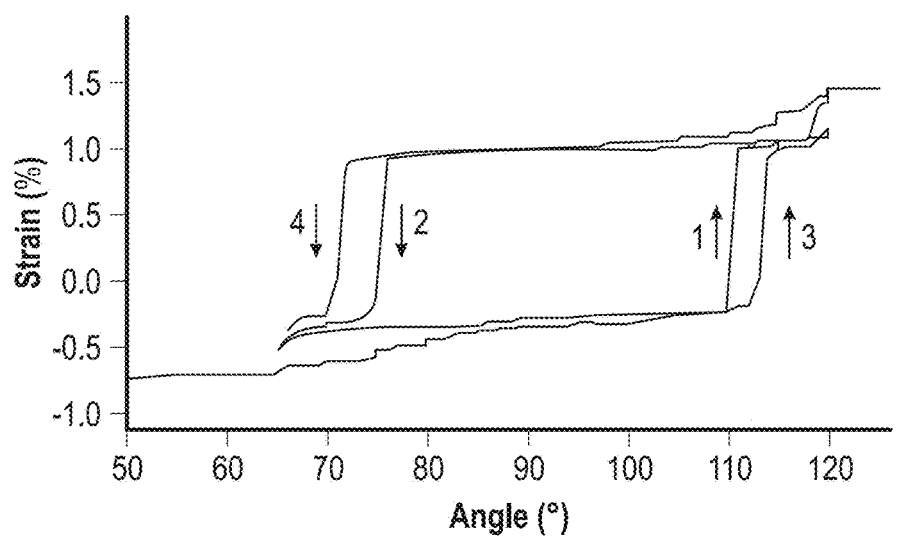
FIG. 22 is a chart depicting an axial normal strain at a surface of an embodiment of a Ni—Mn—Ga wire due to bending in a magnetic field.

FIG. 22 shows the axial surface strain of wire S5 where the magnetic field was cycled between 65 and 120°. Upon increasing the magnetic field angle from 50°, the surface strain slowly increased. When the field angle reached 110° (point 1), the wire deflected to the opposite side and the strain reversed sign. Above 120°, curvature and strain remained almost constant. The field angle was then lowered and the surface strain reduced slowly until the field direction reached 75° where the wire deflected back (point 2). Upon repetition of the field path, the wire deflected back and forth again (points 3 and 4) with a slightly larger hysteresis. Whether this increase is a statistical variation or a systematic trend due to accumulation of defects remains to be studied.

4. CONCLUSIONS

Ni—Mn—Ga microwires were solidified within a drawn Pyrex tube drawn by the Taylor technique and an oligocrystalline grain structure and $L2_1$ crystal structure were obtained by subsequent homogenizing at 1050° C. for 1 h and aging at 700° C. for 12 h. Superelastic deformation up to ~3.5% in the martensite phase and linear elastic deformation of ~0.8% in the austenite phase at ambient temperature were observed by uniaxial tensile tests on wires of various compositions. Magnetic field-induced torque caused large strains in two Ni—Mn—Ga microwires in the martensite phase.

Although various embodiments have been shown and described, the present disclosure is not so limited and will be understood to include all such modifications and variations are would be apparent to one skilled in the art.

What is claimed is:

1. A method comprising:
   retaining, at an anchor, a first end of an actuation member, wherein a length of the actuation member is greater than a width of the actuation member and the length extends from the first end of the actuation member to a second end of the actuation member along a longitudinal axis when the actuation member is undeformed, and wherein the actuation member comprises a magnetic shape memory alloy;
   deforming the actuation member with a magnetic field, wherein a crystallographic orientation of the actuation member relative to the magnetic field causes the second end of the actuation member to move laterally to the longitudinal axis; and
   altering, at a magnetic field source, the magnetic field applied to the actuation member to alter the deformation of the actuation member.

2. The method of claim 1, further comprising moving an object by applying a force to the object with the deformation of the actuation member.

3. The method of claim 1, further comprising applying a force caused by the deformation of the actuation member to a fluid to invoke movement of a body connected to the anchor through the fluid.

4. The method of claim 1, wherein altering the magnetic field applied to the actuation member further comprises setting the magnetic field to a predetermined magnitude that results in a predetermined deformation of the actuation member.

5. The method of claim 1, wherein altering the magnetic field applied to the actuation member further comprises setting the magnetic field to a predetermined direction that results in a predetermined deformation of the actuation member.

6. The method of claim 4, wherein the predetermined deformation results in a predetermined angle of the actuation member at the second end relative to the longitudinal axis.

7. The method of claim 1, wherein a lateral stroke value associated with the actuation member is greater than at least 10% compared to the length of the actuation member.

8. The method of claim 1, wherein a work output of the deformation is based on a shape anisotropy of the actuation member.

9. A system comprising:
   an actuation member having a first end and a second end, wherein a length of the actuation member is greater than a width of the actuation member and the length extends from the first end to the second end along a longitudinal axis when the actuation member is undeformed, and wherein the actuation member comprises a magnetic shape memory alloy;
   an anchor retaining the first end of the actuation member, wherein the second end of the actuation member is free to move laterally to the longitudinal axis in response to a deformation of the actuation member; and
   a magnetic field source in proximity to the actuation member, the magnetic field source configurable to alter a magnetic field applied to the actuation member to adjust the extent of deformation of the actuation member, wherein a crystallographic orientation of the actuation member relative to the magnetic field causes the deformation of the actuation member.

10. The system of claim 9, wherein the actuation member is a cylindrical wire.

11. The system of claim 9, wherein the deformation of the actuation member is caused at least partially due to crystallographic twinning.

12. The system of claim 9, wherein the magnetic shape memory alloy includes a Nickel-Manganese-Gallium alloy.

13. The system of claim 9, wherein the magnetic shape memory alloy is martensitic at or below a standard operating temperature.

14. The system of claim 13 where the standard operating temperature is room temperature and below 25° C.

15. The system of claim 9, wherein the magnetic shape memory alloy is austenitic at or above a threshold temperature above a standard operating temperature.

16. The system of claim 15 where the threshold temperature is about 10 or more degrees higher than the standard operation temperature.

17. The system of claim 9, wherein the magnetic shape memory alloy has a Curie temperature of about 82° C.

18. The system of claim 9, incorporated into at least one device selected from the group consisting of micro-actuators, sensors, magnetic cooling systems, and energy harvesting devices.

19. A method comprising:
   forming an actuation member having a first end and a second end, wherein a length of the actuation member is greater than a width of the actuation member and the length extends from the first end to the second end along a longitudinal axis when the actuation member is undeformed, and wherein the actuation member is formed from a magnetic shape memory alloy;
   connecting the first end of the actuation member to an anchor, wherein the anchor retains the first end of the actuation member while the second end of the actuation member is free to move laterally to the longitudinal axis in response to deformation of the actuation member; and
   positioning the actuation member in proximity to a magnetic field source, the magnetic field source configurable to alter a magnetic field applied to the actuation member to adjust the extent of deformation of the actuation member, wherein a crystallographic orientation of the actuation member relative to the magnetic field causes the deformation of the actuation member.

20. The method of claim 19, wherein forming the actuation member comprises:
   forming a microwire through melt spinning.

21. The method of claim 19, wherein forming the actuation member comprises:
   induction melting precursor rods to form an alloy melt; and
   drawing a glass-coated microwire from the alloy melt.

22. The method of claim 19, wherein forming the actuation member comprises:
  forming a Nickel-Manganese-Gallium microwire.

* * * * *